United States Patent
Mao et al.

(10) Patent No.: US 10,190,746 B1
(45) Date of Patent: Jan. 29, 2019

(54) OPTICAL LENS FOR BEAM SHAPING AND STEERING AND DEVICES USING THE OPTICAL LENS

(71) Applicant: ABL IP HOLDING LLC, Conyers, GA (US)

(72) Inventors: An Mao, Jersey City, NJ (US); Gregory Malone, Herndon, VA (US); Robert M. Krass, Ashburn, VA (US); David P. Ramer, Reston, VA (US); Rashmi Kumar Rogers, Herndon, VA (US); James Michael Phipps, Fairfax, VA (US); Steve Lyons, Herndon, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 0 days.

(21) Appl. No.: 15/868,624

(22) Filed: Jan. 11, 2018

(51) Int. Cl.
| | |
|---|---|
| F21V 7/00 | (2006.01) |
| G02B 6/00 | (2006.01) |
| F21V 5/04 | (2006.01) |
| F21V 23/00 | (2015.01) |
| F21V 17/04 | (2006.01) |

(Continued)

(52) U.S. Cl.
CPC ............... *F21V 5/04* (2013.01); *F21V 5/046* (2013.01); *F21V 17/04* (2013.01); *F21V 23/005* (2013.01); *F21Y 2105/10* (2016.08); *F21Y 2115/10* (2016.08)

(58) Field of Classification Search
None
See application file for complete search history.

(56) References Cited

U.S. PATENT DOCUMENTS

| | | |
|---|---|---|
| 7,222,995 B1 | 5/2007 | Bayat et al. |
| 9,347,642 B2 | 5/2016 | Catalano |
| 9,470,406 B2 | 10/2016 | Catalano |

(Continued)

FOREIGN PATENT DOCUMENTS

DE    102012201494 A1    8/2012

OTHER PUBLICATIONS

Non Final Office Action for U.S. Appl. No. 15/914,619, dated May 18, 2018, 17 pages.

(Continued)

*Primary Examiner* — Dedei K Hammond
(74) *Attorney, Agent, or Firm* — RatnerPrestia

(57) ABSTRACT

An example lighting device has illumination light sources, each configured to be independently driven. The device further includes an optical lens positioned over the illumination light sources. The optical lens has a number of aspheric or spheric convex surfaces, including an input surface and an output surface. The input surface includes an input peripheral portion and an input central portion. The input peripheral portion extends from the illumination light sources and curves from a region of the illumination light sources towards the input central portion. The input central portion curves towards the illumination light sources. The output surface includes an output lateral portion, an output shoulder portion, and an output body portion. Another example uses optical-to-electrical transducers, e.g. light detector or photovoltaic devices, in combination with the optical lens, for light reception transducer applications.

25 Claims, 12 Drawing Sheets

(51) Int. Cl.
*F21Y 105/10* (2016.01)
*F21Y 115/10* (2016.01)

(56) References Cited

U.S. PATENT DOCUMENTS

| | | |
|---|---|---|
| 2004/0070855 A1* | 4/2004 | Benitez .................... G02B 3/02 359/858 |
| 2009/0046454 A1 | 2/2009 | Bertram et al. |
| 2013/0058103 A1 | 3/2013 | Jiang et al. |
| 2014/0036511 A1 | 2/2014 | Whitfield et al. |
| 2014/0084809 A1 | 3/2014 | Catalano |
| 2018/0073686 A1 | 3/2018 | Quilici et al. |

OTHER PUBLICATIONS

Notice of Allowance for U.S. Appl. No. 15/914,619, dated Jul. 20, 2018, 15 pages.
Non Final Office Action for U.S. Appl. No. 15/924,868, dated Oct. 4, 2018, 18 pages.
Notice of Allowance for U.S. Appl. No. 15/924,868 dated Dec. 4, 2018, 9 pages.

* cited by examiner

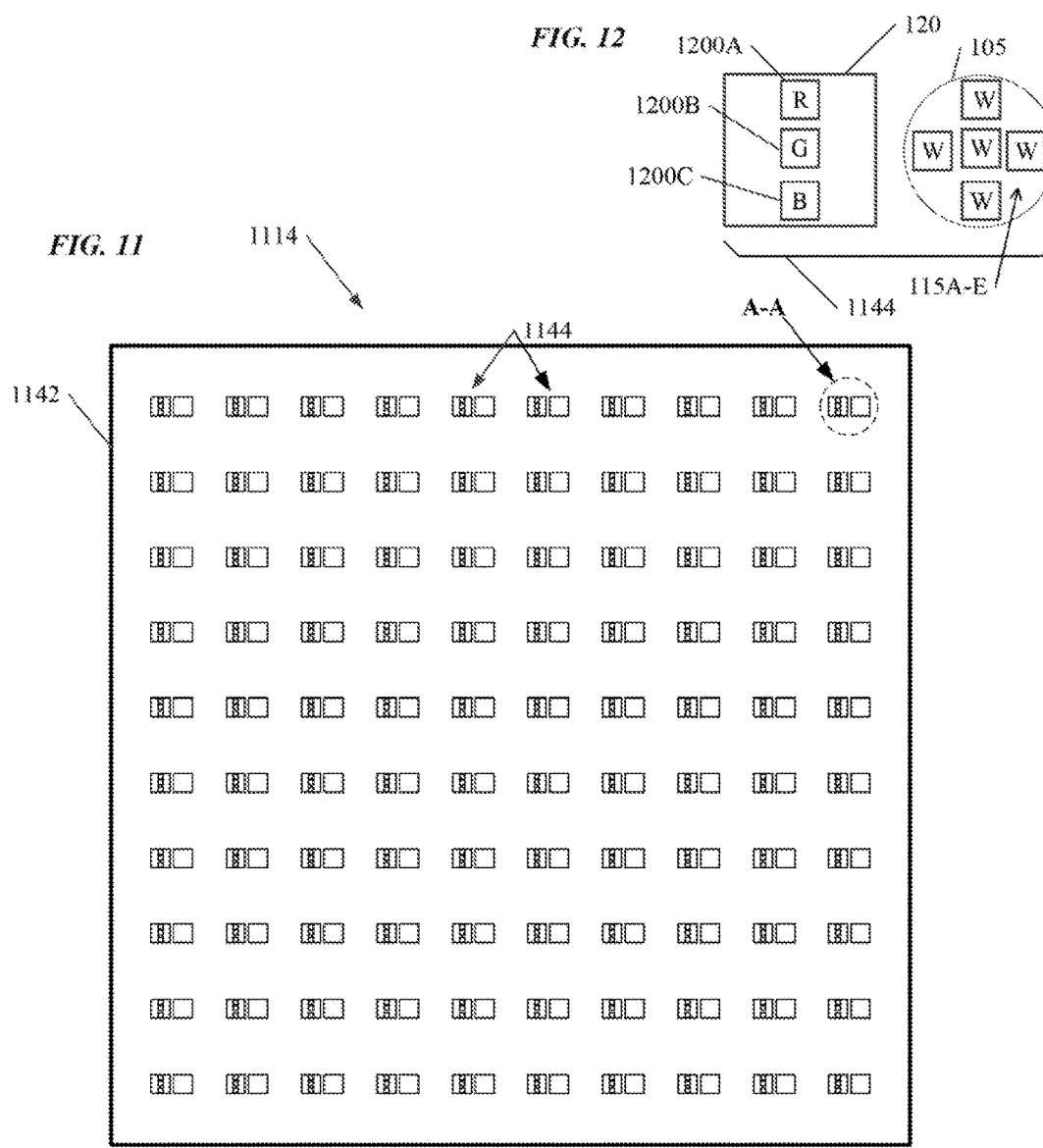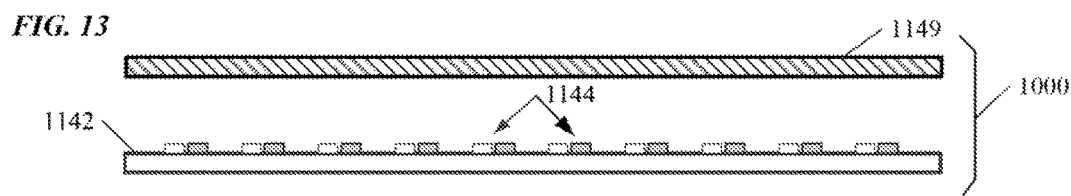

OPTICAL LENS FOR BEAM SHAPING AND STEERING AND DEVICES USING THE OPTICAL LENS

TECHNICAL FIELD

The present subject matter relates to an optical lens for a lighting device, e.g., a luminaire for illumination lighting, a combined luminaire and display, or one or more optical/electrical transducers.

BACKGROUND

Typical luminaires output illumination lighting at one beam angle. If changes to the output light pattern of the illumination lighting are desired, e.g., in a restaurant, the luminaire can be modified mechanically, which necessitates human labor and costs associated therewith. Some luminaires in the marketplace claim to provide different beam angles, but sacrifice optical efficiency (e.g., by blocking the light), or have a very large format size. For example, a two lens system can change the relative distance of the two lenses, which changes the total focus of the system, as a result the beam shape can change. Illumination lighting luminaires also exist with electrically controllable beam shaping and steering optical systems, but costs of such systems can be very high and have reliability problems.

There is also no luminaire product in the market which combines a low cost, reliable beam shapeable and steerable luminaire together with a display. While several ways to combine a luminaire and a display together exist, e.g. put the luminaire underneath the transparent display, the transparent display can be costly and have a low transparency, which leads to low optical efficiency of the whole system. For example, a state of the art transparent organic light emitting diode (LED) display has about a 40% transparency, which greatly decreases the optical efficiency of any illuminating lighting underneath. Some of these combined luminaire and display type devices introduce light scattering for the incident light coming from an illumination lighting board.

SUMMARY

In an example, a lighting device includes a plurality of individually controllable illumination light sources. The lighting device further includes an optical lens positioned over the illumination light sources. The optical lens has a plurality of aspheric or spheric surfaces, including an input surface coupled to receive light from the illumination light sources and an output surface. The input surface includes an input peripheral portion and an input central portion. The input peripheral portion extends from the illumination light sources and curves from a region of the illumination light sources towards the input central portion. The input central portion curves towards the illumination light sources. The output surface includes an output lateral portion, an output shoulder portion, and an output body portion. The output lateral portion extends away from the light source, curves away from the input peripheral portion, and intersects the output shoulder portion. The output shoulder portion abuts the output body portion. The output body portion curves outwards from the light source and the output shoulder portion.

Incoming light rays for illumination lighting emitted by at least one of the illumination light sources can first pass through the input surface where the incoming light rays undergo refraction to shape or steer the illumination lighting. After passing through the input surface, the refracted incoming light rays can then pass through the output surface where the refracted incoming light rays undergo further refraction to shape or steer the illumination lighting.

Alternatively or additionally, after passing through the input surface, the refracted incoming light rays can then strike the output lateral portion where the incoming light rays undergo total internal reflection (TIR) to further shape or steer the illumination lighting. After striking the output lateral portion, the refracted and TIR incoming light rays can pass through the output shoulder portion with further refraction.

In another example, an optical device comprises a plurality of optical-to-electrical transducers and to be individually activated for outputting the respective electrical signal in response to light. Each optical-to-electrical transducer is configured to be driven by received light to produce an electrical signal and to be individually activated for outputting the respective electrical signal in response to light. The optical device further includes an optical lens positioned over the optical-to-electrical transducers. The optical lens has a plurality of aspheric or spheric surfaces, including an input surface and an output surface coupled to direct light to the optical-to-electrical transducers. The input surface includes an input lateral portion, an input shoulder portion, and an input body portion. The input lateral portion extends towards the optical-to-electrical transducers, curves towards the input peripheral portion, and intersects the output shoulder portion. The input shoulder portion surrounds the input body portion. The input body portion curves outwards from the input shoulder portion. The output surface includes an input peripheral portion and an input central portion. The input peripheral portion curves around the optical-to-electrical transducers towards the input central portion. The input central portion curves towards the optical-to-electrical transducers.

Incoming light rays to drive one or more of the optical-to-electrical transducers first pass through the input surface where the incoming light rays undergo refraction. After passing through the input surface, the refracted incoming light rays then pass through the output surface where the refracted incoming light rays undergo further refraction to shape or steer the light rays to be selectively received by at least one of the optical-to-electrical transducers.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations, by way of example only, not by way of limitations. In the figures, like reference numerals refer to the same or similar elements.

FIG. 11 is a plan view of a light emitting diode (LED) circuit board layout including both a matrix of integral red (R), green (G), blue (B) LED devices for image display light generation and a matrix of higher intensity white (W) LEDs for generating controllable illumination light output for a general lighting application for coupling to an optical lens.

FIG. 12 is an enlarged view of a section of the LED circuit board of the lighting device of FIG. 11, corresponding to the dashed circle A-A in FIG. 11.

FIG. 13 is an end view of the lighting device of FIG. 11 in combination with a diffuser.

DETAILED DESCRIPTION

Figure 1:
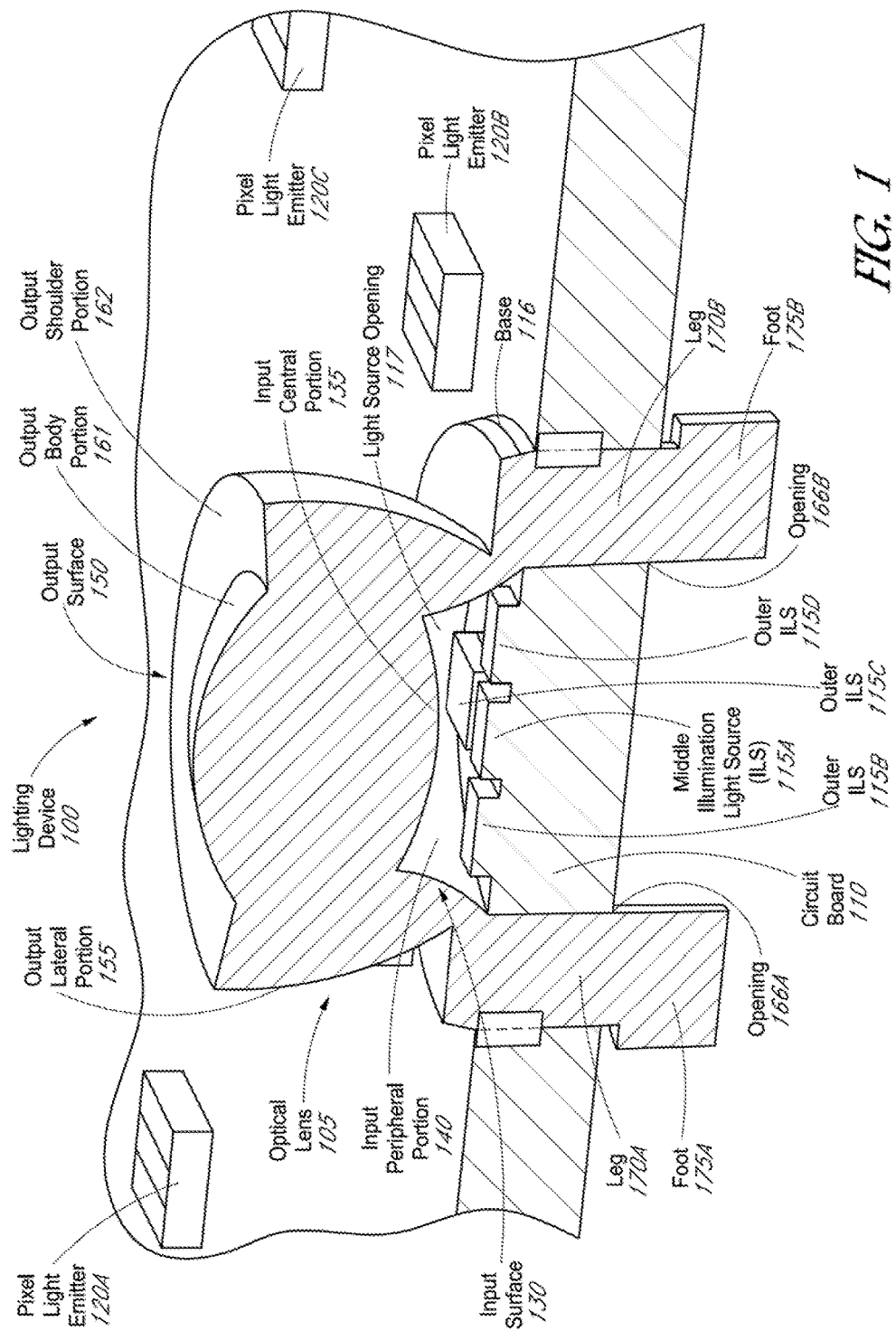
FIG. 1 is a perspective view of a lighting device, including a circuit board with multiple illumination light sources and an optical lens positioned over the illumination light sources on the circuit board.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

In order to address the cost, reliability, efficiency, manufacturing issues of a beam shapeable and steerable luminaire, a passive optical lens is utilized. There may be no moving parts in the whole system, for example, just by turning on illumination light sources (e.g., light emitting diodes) at different location underneath the passive optical lens, beam shaping and steering can be achieved. By applying this passive optical lens to a coplanar lighting and display circuit board, with a diffuser on top of the passive optical lens, for example, a low cost, high efficiency, and easily manufactured lighting device that combines a luminaire with beam shaping, steering, and a display is achieved. The coplanar circuit board can include various illumination light sources for space lighting and pixel light emitters to display an image.

The size of the passive optical lens can vary, if the passive optical lens is too large, then lighting emitted by pixel light emitters forming the display may be blocked, which distorts the displayed image. A miniature sized passive optical lens can be utilized to avoid large distortion of the displayed image, but that is still large enough to cover multiple illumination light sources for beam shaping and steering. The passive optical lens can be designed to fulfill both the illumination and display functions.

The passive optical lens and associated light sources may be used in luminaires, per se, although several examples disclosed herein relate to luminaires that offer both general illumination capabilities and controllable image display capabilities and systems that include such luminaires. In on example, a low cost, reliable, high efficiency, and easily manufactured and assembled luminaire that can provide beam steering and shaping function is provided. In another example, a low cost, high efficiency combined luminaire and display device with beam shaping and steering is needed.

Such a luminaire, for example, may enable either lighting with an adjustable distribution, or a display showing a user selected image in a display state, by using the lighting component that is transparent and co-planar or placed over the image-light output of a full color display.

The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or area of a premises to a level useful for a human in or passing through the space, e.g., of sufficient intensity for general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below.

Terms such as "artificial lighting" or "illumination lighting" as used herein, are intended to encompass essentially any type of lighting that a device produces light by processing of electrical power to generate the light. A luminaire for an artificial lighting or illumination lighting application, for example, may take the form of a lamp, light fixture, or other luminaire arrangement that incorporates a suitable light source, where the lighting device component or source(s) by itself contains no intelligence or communication capability. The illumination light output of an artificial illumination type luminaire, for example, may have an intensity and/or other characteristic(s) that satisfy an industry acceptable performance standard for a general lighting application.

The luminaires discussed by way of example in further detail below support both artificial lighting for general illumination applications and controllable display capabilities. For that purpose, such a luminaire includes a general illumination device and a display for generating light forming an image output. The general illumination device includes illumination light source emitters of illumination light within the luminaire. The display or at least a portion/element thereof is transmissive or sufficiently transparent to enable illumination from the illumination light source emitters of the general illumination device to pass through so that illumination light output emerges from the same output surface as display image light output from the luminaire. The passive optical lens and group of light sources, however, are applicable to luminaire configurations that omit the display elements.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

Light output from the luminaire may carry information, such as a code (e.g. to identify the luminaire or its location) or downstream transmission of communication signaling and/or user data. The light based data transmission may involve modulation or otherwise adjusting parameters (e.g. intensity, color characteristic or distribution) of the illumination light out or an aspect (e.g. modulation of backlighting and/or adding a detectable code to portion of a displayed image) of the light output from the display device.

The orientations of the lighting device, luminaire, associated components and/or any complete devices incorporating a passive optical lens such as shown in any of the drawings, are given by way of example only, for illustration and discussion purposes. In operation for a particular variable optical processing application, the lighting device and passive optical lens may be oriented in any other direction suitable to the particular application of the lighting device and the passive optical lens, for example up light or side light or any other orientation. Also, to the extent used herein, any directional term, such as lateral, longitudinal, left, right, up, down, upper, lower, top, bottom, and side, are used by way of example only, and are not limiting as to direction or orientation of any optic or component of an optic constructed as otherwise described herein.

Reference now is made in detail to the examples illustrated in the accompanying drawings and discussed below.

FIG. 1 is a perspective view of a lighting device 100, including a circuit board 110 with multiple general illumination light sources (ILS) 115A-D and an optical lens 105. By controlling which of the multiple illumination light sources 115A-D are turned off, on, or dimmed, the optical lens 105 of the lighting device 100 can beam shape. The optical lens 105 is a freeform lens with multiple surfaces of different shapes that can exhibit refractive behavior, or total internal reflection (TIR) that is variable. The optical lens 105 can take multiple illumination light source 115A-D coupled at different locations to an input surface 130 of the optical lens 105 and direct or shape illumination lighting from the different illumination light sources 115A-D into different beam patterns, for example.

The illumination light sources 115A-D are electrical transducers to convert an electrical signal into light output, in other words, transform electrical power into light. As explained in more detail in FIGS. 8-9, the optical lens 105 can also be utilized with an optical transducer, such as a photo sensor or a photovoltaic device. The illumination light sources 115A-D can be a white light source, but in many applications the illumination light sources 115A-D can be color controllable (e.g., red, green, and blue). The number of illumination light sources 115A-D in the lighting device 100 can be more or less than that shown. The lighting device 100 may also include multiple pixel light emitters 120A-C to form an image display. Although only 3 pixel light emitters 120A-C are shown in FIG. 1, it should be understood that many hundreds or thousands of pixel light emitters can be arranged in rows and columns to form a matrix of the display. In other examples, the lighting device 100 may not include a display element and does not have pixel light emitters 120A-C. Returning to the example, the multiple pixel light emitters 120A-C are located on the circuit board 110 and are co-planar with the multiple illumination light sources 115A-D in the lighting device 100, but disposed outside of the optical lens 105 so as to not be covered by the input surface 130. The circuit board 110 can be a flexible or rigid type printed circuit board with both illumination light sources 115A-D and pixel light emitters 120A-C disposed thereon, or in some examples, just illumination light sources 115A-D or pixel light emitters 120A-C are disposed on the circuit board 110. In some examples, the pixel light emitters 120A-C are disposed on a separate display lighting board and the circuit board that the illumination light sources 115A-D are disposed on is an illumination lighting board. The display lighting board and the illumination lighting board are optically coupled. Hence, the illumination light sources 115A-D may not be co-planar with the pixel light emitters 120A-C, but still co-located with the illumination light sources emitters 115A-D in the lighting device 100.

Various types of illumination light sources 115A-D may be used, such as one or more organic light emitting diodes (OLEDs); one or more micro LEDs; one or more nanorod or nanowire LEDs; at least one fluorescent lamp; or at least one halogen lamp. In some examples, the optical lens 105 can be utilized to steer or shape outputted light from optical fiber instead of illumination light sources 115A-D. In an example, illumination light source emitters 105x include a number of layers forming one or more actual OLEDs (e.g., a stack including multiple emissive, anode, cathode, and transport layers. The pixel light emitters 120A-C can be made of the same light sources as illumination light sources 115A-D (e.g., LEDs) and are arranged in an array on the circuit board 110 to form an image display device. Each pixel light emitter 120A-C is controllable to emit light for a respective pixel of a displayed image.

In an example, a luminaire incorporates the lighting device 100 of FIG. 1. The multiple pixel light emitters 120A-C forming the display and the general illumination light sources 115A-D include respective light emission matrices co-located in the lighting device 100. The general illumination light sources 115A-D and the pixel light emitters 120A-C forming the display are configured such that, at an output of the luminaire, available output regions of the light emission matrices at least substantially overlap. In specific examples, the overlap extends across the entire output of the luminaire, so that each matrix of emitters can output respective display or general illumination light via all of the luminaire output or via any one or more smaller areas or portions of the luminaire output. A diffuser can be incorporated into the luminaire to reduce distortion of the display device and provide color integration to smooth the illumination beam patterns.

The optical lens 105 of the lighting device 100 can be utilized in a luminaire that includes both general illumination light sources and transparent displays. Examples of such luminaires with both general illumination light sources and transparent displays which use light emission matrices to emit output light of images suitable for application in the software configurable lighting devices are disclosed in U.S. patent application Ser. No. 15/198,712, filed Jun. 30, 2016, entitled "Enhancements of a Transparent Display to Form a Software Configurable Luminaire," U.S. patent application Ser. No. 15/211,272, filed Jul. 15, 2016, entitled "Multi-Processor System and Operations to Drive Display and Lighting Functions of a Software Configurable Luminaire," U.S. patent application Ser. No. 15/467,333 filed Mar. 23, 2017, entitled "Simultaneous Display and Lighting;" U.S. patent application Ser. No. 15/468,626, filed Mar. 24, 2017 entitled "Simultaneous Wide Lighting Distribution and Display;" U.S. patent application Ser. No. 15/357,143, filed Nov. 21, 2016, entitled "Interlaced Data Architecture for a Software Configurable Luminaire," U.S. patent application Ser. No. 15/095,192, filed Apr. 11, 2016, entitled "Luminaire Utilizing a Transparent Organic Light Emitting Device Display;" and U.S. patent Ser. No. 15/611,349, filed Jun. 1, 2017, entitled "Illumination And Display Control Strategies, To Mitigate Interference Of Illumination Light Output With Displayed Image Light Output," the entire contents all of which are incorporated herein by reference. These incorporated applications also disclose a variety of implementations of a general illumination light source including a second light emission matrix co-located with an emission matrix of a transparent display.

These incorporated applications also disclose an electrowetting lens or cell or other controllable optics for beam shaping and steering of the illumination light sources. It should be understood that the optical lens 105 can be used in lieu of the electrowetting lens or cell and other controllable optics disclosed in these incorporated applications.

In the example, the optical lens 105 is an optical lens positioned over the illumination light sources 115A-D to cover the illumination light sources 115A-D. As shown, the illumination light sources 115A-D are disposed on the circuit board 110 and covered by the optical lens 105, particularly the input surface 130. The optical lens 105 may be formed of a solid material that can be light transmissive. In order to show the illumination light sources 115A-D under the optical lens 105, only half of the optical lens 105 is visible in FIG. 1. However, it should be understood that the remaining half of the optical lens 105 which is not visible in FIG. 1 is a mirror image of the visible portion of the optical lens 105 as further shown in FIGS. 6-7.

Multiple illumination light sources 115A-D are disposed on the circuit board 110, specifically a middle illumination light source 115A, left outer illumination light source 115B, right outer illumination light source 115D, top outer illumination light source 115C, and a fifth bottom outer illumination light source 115E (not shown). This is just one example and the number and layout of the illumination light sources 115A-D can vary depending on the application. In the example of FIG. 1, there are actually five total illumination light sources 115A-D. However, the fifth bottom outer illumination light source is not visible 115E. In the depicted example lighting device 100, three sides of a middle illumination light source 115A have an outer illumination light source 115B-D adjacent to that side to form a cross-like arrangement. The While the fifth outer illumination light source is not visible, the fifth illumination light source is a mirror image of outer illumination light source 115C. Each of the illumination light sources 115A-D are configured to be driven by electrical power to emit light for illumination lighting. In some examples, the illumination light sources 115A-D can be patterned OLEDs that form a circular shape. Illumination light sources 115A-D can also be rotated relative to the circuit board 115 or nine illumination light sources can be located under the optical lens 105 instead of five, for example. The number of the illumination light sources is not limited to 5 and can be any number of illumination light sources that may fit underneath the optical lens 105.

The optical lens 105 is a transmissive optical device that can focus or disperse incoming light beam rays utilizing refraction. Various materials can be used to form the optical lens 105, such as acrylic, silicone, polycarbonate, glass, plastic, or a combination thereof. Different materials have different refractive indices, hence the geometry of the optical lens 105 can be adjusted depending on the desired optical properties. Typically, the material to form the optical lens 105 is optically clear with respect to the visible light wavelength. The optical lens 105 can be formed of a single piece of transparent material or be a compound lens formed of several lens materials or elements arranged on a common axis. The materials forming the optical lens 105 can be ground, and then molded or extruded to the desired shape and then polished, or injection molded. A diffuser surface can be added to the optical lens 105 to help with color separation. For example, texture can be added to output body portion 161 and output shoulder portion 162 by roughening up those portions to smooth out the light distribution as well as improve color mixing. Or an additional diffuser layer can be added above the optical lens 105 in the lighting device 100 to smooth out the light distribution and reduce color separation. A diffuser eliminates striations in the projection of the illumination lighting to make the illumination lighting relatively smooth and can be utilized in the lighting device 100 even when an image display element (e.g., pixel light emitters 120A-C) is not included. A separate diffuser can be included in the lighting device 100 for each passive lens 105 (e.g., one diffuser per passive lens 105 to diffuse the illumination lighting from the group of five illumination light sources 115A-α covered by that passive lens 105). In some examples, a separate diffuser can be included in the lighting device 100 for each of the illumination light sources 115A-D (e.g., one diffuser per illumination light source 115A-D). Or a single diffuser can be included in the entire lighting device 100 for all of the illumination light sources and passive lenses.

Optical lens 105 may have a plurality of aspheric or spheric surfaces. The convex surfaces forming the optical lens 105 can refract the incoming light rays that pass through such that the incoming parallel light rays converge towards each other. As shown, the optical lens 105 includes an input surface 130 and an output surface 150. The input surface 130 and output surface 150 can each include various surface portions with different shapes, sometimes convex, flat (e.g., to exhibit no refractive behavior), or concave to achieve different optical distributions and beam angles. The input surface 130 includes an input peripheral portion 140 and an input central portion 135. The input peripheral portion 140 may form a light source opening 117 in an end of the optical lens 105 to cover and collect light output from the illumination light sources 115A-D. Whether the entire structure of the illumination light sources 115A-D are inside the light source opening 117 or just the top surface of the illumination light sources 115A-D depends on the lighting distribution requirements.

In the example, the input peripheral portion 140 extends from the circuit board 110 and curves from a region of the circuit board 110 towards the input central portion 135. In the circular shaped optical lens 105 example of FIG. 1, the input peripheral portion 140 also curves around the illumination light sources 115A-D. The input central portion 135 curves towards the circuit board 110. The output surface 150 includes an output lateral portion 155, an output shoulder portion 162, and an output body portion 161. The output lateral portion 155 extends away from the circuit board 110, curves away from the input peripheral portion 140, and intersects the output shoulder portion 162. The output shoulder portion 162 surrounds the output body portion 161. The output body portion 161 curves outwards from the circuit board 110 and the output shoulder portion 162.

The optical lens 105 is shown in FIG. 1 with a profile shaped like a half of a circle. Hence, in the example, the whole optical lens 105 is actually circular shaped as further shown in FIG. 6-7. The shape of the optical lens 105 can be rectangular as in FIG. 2, circular as in FIG. 1, elliptical, square, rotated with facets like a polygon, etc. As shown, the optical lens 105 has a light source opening 117 to receive the illumination light sources 115A-D and the perimeter of the light source opening 117 may generally follow the profile shape of the optical lens 105. The output shoulder portion 162 is annularly arranged around the output body portion 161. The input peripheral portion 140 is annularly arranged around the plurality of illumination light sources 115A-D. The output body portion 161 and the input central portion 135 each can have an aspheric contour and curve in opposing directions. The output shoulder portion 162 can be flat, sloped (e.g., upwards or downwards), or curved (depending on the specific beam distribution requirement) relative to a circumference of the output body portion 161 where the output shoulder portion 162 surrounds the output body portion 161.

In addition to being circular shaped, it should be understood that in some examples the optical lens 105 can be oval shaped. The output shoulder portion 162 is continuously arranged around the output body portion 161. The input peripheral portion 140 is continuously arranged around the plurality of illumination light sources 115A-D.

The optical lens 105 controls beam shaping and steering from incoming light. For example, incoming light rays for illumination lighting emitted by at least one of the illumination light sources 115A-D first pass through the input surface 130 where the incoming light rays undergo refraction to shape or steer the illumination lighting. After passing through the input surface 130, the refracted incoming light rays then pass through the output surface 150 where the refracted incoming light rays undergo further refraction to shape or steer the illumination lighting. In one example, the shaping or steering provides for adjusting parameters of the illumination lighting (e.g. intensity, or distribution, direction of the optic, output light pattern, beam shape). The multiple illumination light sources 115A-D under the optical lens 105 can be selectively turned on/off to control beam shape, for example.

Optical lens 105 includes a base 116 at the bottom which is a supporting mechanical structure coupled to the circuit board 110. Whether the base 116 of the optical lens 105 is on the same level (e.g., plane) as the illumination light sources 115A-D or lower than the illumination light sources 115A-D can depend on the specific light source distribution requirements. Two legs 170A-B extend longitudinally from the base 116 in the example, although the number of legs 170A-B can vary. A respective foot 175A-B is coupled to a distal end of respective legs 170A-B, however, the number of feet 175A-B can vary. The feet 175A-B extend laterally with respect to the base 116. The legs 170A-B extend longitudinally through a respective opening 166A-B formed in the circuit board 110. The feet 175A-B extend laterally beneath the circuit board to secure the optical lens 105 to the circuit board 110. The base 116, legs 170A-B and feet 175A-B of the optical lens 105 typically do not have an optical function, but serve to hold or mount the optical lens 105 on the circuit board 110. The feet 175A-B are for a pass thru snap fit to the circuit board 110. Other ways to attach the optical lens 105 to the circuit board 110 can include a press pin fit, glue or double side tape. In some examples, legs 170A-B and feet 175A-B may not be utilized and the optical lens 105 can be glued or taped using the base 116 if there is an alignment feature on the circuit board 110. Also, the legs 170A-B and feet 175A-B can be removed or other mechanical method can be used instead to hold the optical lens 105 depending on the application requirements.

Figure 2:
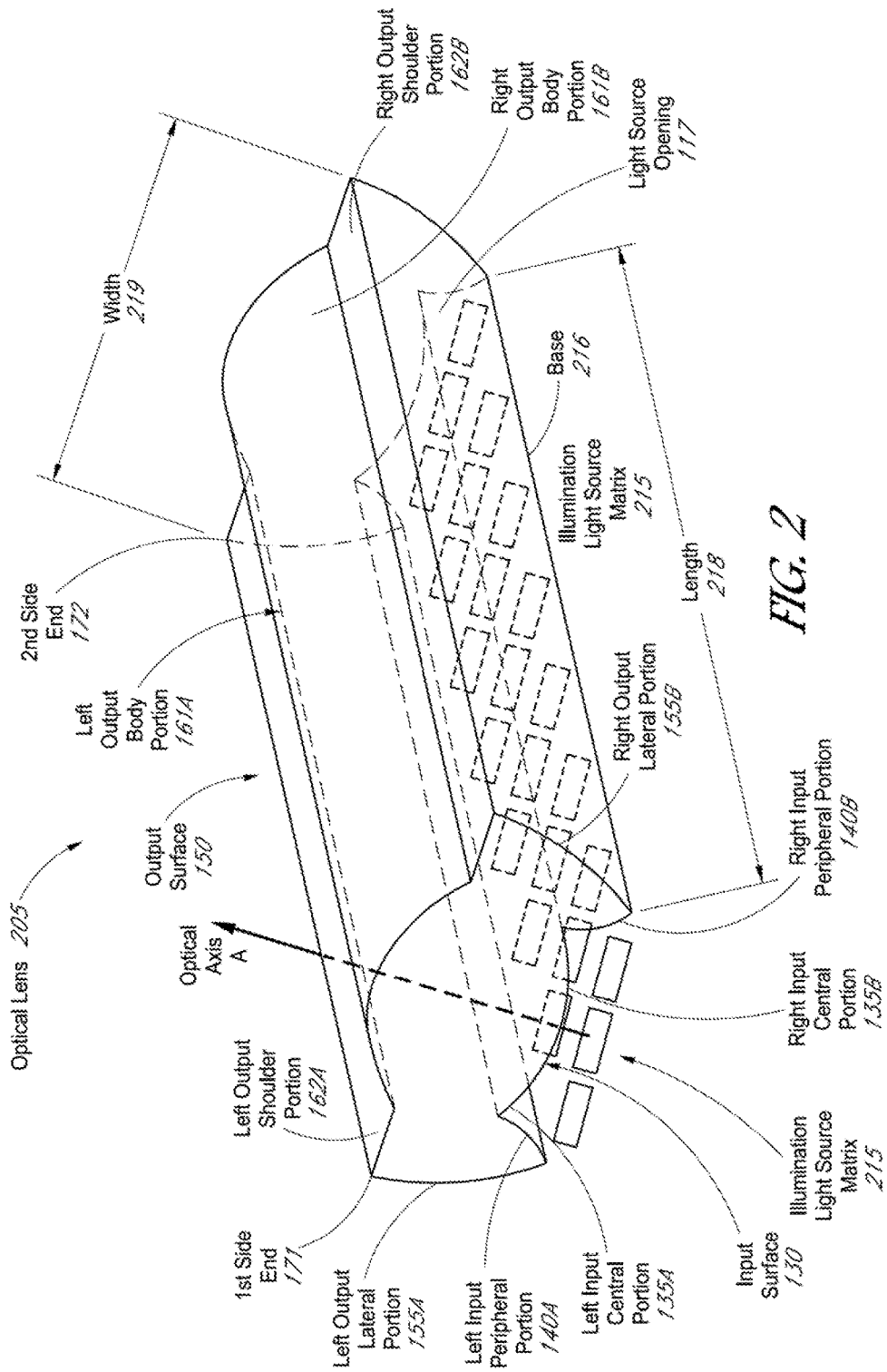
FIG. 2 is an isometric view of an optical lens with an elongated rectangular shape with an illumination light source matrix disposed inside the optical lens.

FIG. 2 is an isometric view of an optical lens 205 with an elongated rectangular shape with an illumination light source matrix 215 disposed inside the optical lens 205. Such an elongated shape can be formed by extrusion. In the example, a cross-section of the optical lens 205 is shown on a first side end 171 and a second side end 172. An optical axis A of the optical lens 205 passes through a middle of the input central portion 135 and the output body portion 161 of the optical lens 205 and bisects the cross-section of the optical lens 205 into left and right sides. Hence, the output shoulder portion, for example, includes left and right output shoulder portions 162A-B which are linearly arranged on opposing sides of a length of the output body portion. The length of the output body portion spans from where the right output lateral portion 155B intersects the right output shoulder portion 162B on the first side end 171 to where the right output lateral portion 155B intersects the right output shoulder portion 162B on the second side end 172. The input periphery portion includes left and right input peripheral portions 140A-B which are aspheric surfaces that are linearly arranged on opposing sides of the input central portion 135.

As shown, optical lens 205 has a light source opening 117 to receive the illumination light source matrix 215 and the illumination light source matrix 215 is disposed underneath the passive lens 205 in the light source opening 117. In the rectangular shaped passive lens 205 example (as well as a square shaped example), the optical lens 205 may be defined by a length 218 and a width 219 which can be variable in relation to each other. The length 218 spans from where the right output lateral portion 155B intersects the right input peripheral portion 140B on the first side end 171 to where the right output lateral portion 155B intersects the right input peripheral portion 140B on the second side end 172. The width 219 spans from where the left output lateral portion 155A intersects the left input peripheral portion 140A on the second side end 172 to where the right output lateral portion 155B intersects the right input peripheral portion 140B on the second side end 172. Although not shown in FIG. 2, a base can be included that has a snap on feature or one or more legs that run along the bottom of the optical lens 205, which may extend longitudinally from the bottom and connect to the perimeter of the illumination light source matrix 215 for the required standoff distance as needed.

A plurality of illumination light sources are arranged inside the light source opening 117 of the optical lens 205 in rows and columns in a grid like arrangement, for example, to form the illumination light source matrix 215 inside the optical lens 205 of the lighting device. The illumination light source matrix 215 can include a long linear series of rows of illumination light sources (e.g., 40 rows with 3 illumination light sources per row), where each row spans the width 219 of passive lens 205. Illumination light source matrix 215 can be positioned underneath the optical lens 205 and covered by the optical lens 205 throughout. In some examples, the illumination light source matrix 215 can be made up of alternating rows that include alternating numbers of two and three illumination light sources in every other row to make the beam appear to steer more smoothly. In addition, the alternating rows of illumination light sources can be staggered such that the alternating rows with two illumination light sources fill the gaps between the alternating rows with three illumination light sources along the length 218 instead of the width 219 of the three light source rows. Also, the alternating rows may include alternating numbers of four and five illumination light sources to make the beam appear to steer more smoothly. In some examples, the alternating rows can include illumination light sources with varying color temperatures (e.g., 3,000 Kelvin, 4,000 Kelvin 5,000 Kelvin) in which alternating rows of two and three illumination light sources or alternating rows of four and five illumination light sources are utilized. The number of illumination light sources in the rows and columns of the illumination light source matrix 215 can be more or less depending on the application.

Each of the illumination light sources in a row is part of a different column of the illumination light source matrix 215, where each column spans the length 218 of the optical lens 205. In the depicted example, there are 8 rows and 3 columns in the illumination light source matrix 215 and thus each column includes 8 illumination light sources for a total of 24 illumination light sources in the illumination light source matrix 215. In another example, there are 40 rows and 3 columns in the illumination light matrix 215 and thus each column includes 40 illumination light sources for a total of 120 total illumination light sources in the illumination light source matrix 215. Each of the columns is a channel (e.g., 3 channels in the example) which can be a string of illumination light sources; and each channel is coupled to a separate 50 Watt channel output of a 3 channel illumination light source driver. Alternatively, a switch can be placed at the end of each of the 3 channels so that only a single channel illumination light source driver can be utilized instead of a 3 channel illumination light source driver to reduce the cost of the illumination light source driver.

The illumination light sources in each channel can be individually controlled to be turned on, off, or dimmed anywhere along the channel to create different combinations; and can be driven in groups such as rows or columns. Light output from the illumination light sources can be adjusted between 0% to 100% (dimmed) to obtain different beam patterns and shaping. For example, the illumination light sources in different positions (left channel, middle channel, or right channel) can be turned on, off, or dimmed to vary the light intensity, either individually or in combination, to change the beam pattern and thus achieve beam shaping.

In one example, when the entire left channel is turned on and the middle and right channels are off, a beam angle with the light focused and concentrated on the left side is created for a spot lighting application to illuminate a first area of the room (e.g., a wall of an office worker's cubicle). When the entire right channel is turned on and the middle and left channels are off, a beam angle with the light focused and concentrated on the right side is created for a spot lighting application to illuminate a different second area of the room (e.g., the office worker's chair in the cubicle). When the entire middle channel is turned on and the left and right channels are off, a beam angle with the light focused and concentrated on the middle side is created for a spot lighting application to illuminate a third different area of the room (e.g., the office worker's desk in the cubicle). When the left, middle, and right channels are all on, a diffuse or wide beam angle is created for wide flood lighting or diffuse lighting applications. When the left channel in combination with the middle channel are turned on, a beam angle with the light focused and concentrated on the left and middle side is created for flood lighting applications. When the right channel in combination with the middle channel are turned on, a beam angle with the light focused and concentrated on the right and middle side is created for flood lighting applications.

In some examples, white illumination light sources are used with different correlated color temperatures (CCTs) and the illumination light source driver may selectively turn, off, or dim only those illumination light sources that are in a group with a particular CCT in a channel. In one example, only the illumination light sources in a group with a CCT of 3,000 Kelvin are driven on by the illumination light source driver. Alternatively, only the illumination light sources with a CCT of 4,000 Kelvin or 5,000 Kelvin on a particular channel are turned on by the illumination light source driver to obtain different lighting effects.

In some examples, there may be a bit more separation between groups of illumination light sources of the illumination light source matrix 215 and the input surface 130, such that some of the illumination light sources can reside outside of the base 216, for example under a different optical lens. The optical lens 205 has a profile that is an elongated rectangular shape. Although shown as having a rectangular shape, in some examples the optical lens 205 may be in the shape of a square or other polygon. Also, the optical lens may be circular or oval shaped as described in FIG. 1 and shown in FIGS. 6-7, in which case the base 216 can be defined by a circumference, etc. depending on the profile.

In the example, the left output lateral portion 155A extends away from the circuit board (not shown, but the illumination light source matrix 215 is disposed on the circuit board 215), curves away from the left input peripheral portion 140A and intersects the left output shoulder portion 162A. The right output lateral portion 155B also extends away from the circuit board, curves away from the right input peripheral portion 140B and intersects the right output shoulder portion 162B.

The left output shoulder portion 162A intersects the left output lateral portion 155A and the left output body portion 161A. The right output shoulder portion 162B intersects the right output lateral portion 155B and the right output body portion 161B. As shown, the left output lateral portion 155A and the right output lateral portion 155B have an aspheric contour and curve in opposing directions. The left input central portion 135A and the right input central portion 135B have an aspheric contour and curve in opposing directions.

In some examples, such as that shown in FIG. 2, the left side and right portions of the optical lens 205 may have asymmetric surface profiles (e.g., curved or sloped) to, for example, obtain different effects for illumination light sources. That is to say, the left and right portions of the output surface 150 and input surface 130 may be asymmetric with respect to the optical axis A. For example, the left output body portion 161A may have a different surface profile than the right output body portion 161B; and the left output shoulder portion 162A may have a different surface profile than the right output shoulder portion 162B. The left output lateral portion 155A may have a different surface profile than the right output lateral portion 155B. The left input central portion 135A may have a different surface profile than the right input central portion 135B. The left input peripheral portion 140A may have a different surface profile than the right input peripheral portion 140B. Such asymmetric surface profiles of the passive lens 205 can achieve different beam angles, lighting distribution, etc. for the illumination light sources in the middle, left, or right side of the illumination light source matrix 215, for example.

Figure 3:
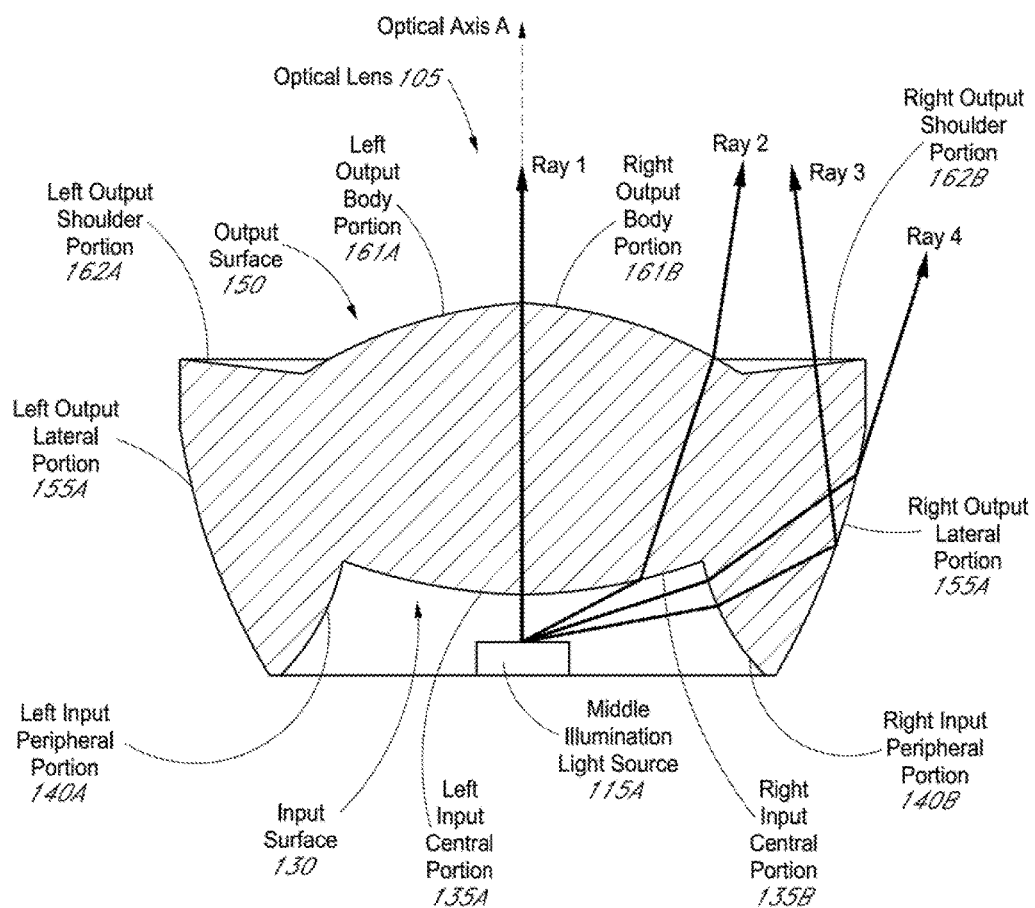
FIG. 3 is a cross-sectional view of an optical lens like shown in either of FIGS. 1-2 and traces of light rays emitted by a middle illumination light source steered or shaped through the surfaces.

FIG. 3 is a cross-sectional view of the optical lens of FIGS. 1-2 illustrating steering or shaping through aspheric or spheric convex surfaces, for example. Traces of several light rays emitted by a middle illumination light source 115A through the surfaces of the optical lens 105 are depicted. The optical lens 105 narrows the beam distribution for the depicted middle illumination light source 115A.

In the example, a cross-section is of the optical lens 105 is illustrated in which an optical axis of the optical lens 105 passes through a middle of the input central portion 135 and the output body portion 161 of the optical lens 105 and bisects the cross-section of the optical lens 105 into left and right sides. Hence, the left side of the cross-section includes a left output lateral portion 155A, a left output shoulder portion 162A, a left output body portion 161A, a left input peripheral portion 140A, and a left input central portion 135A. The right side of the cross-section includes a right output lateral portion 155B, a right output shoulder portion 162B, a right output body portion 161B, a right input peripheral portion 140B, and a right input central portion 135B. As long as there is a refractive index change, a light ray will typically follow the Fresnel law for refraction and reflection. For refraction, the only situation that the propagation angle does not change is when the incident ray is normal to the interface where there is an index change.

As shown, middle illumination light source 115A is in the center underneath the optical lens 105. For the middle illumination light source 115A, the optical lens 105 behaves like a collimating lens for incoming light rays emitted by the middle illumination light source 115A. As shown, rays emitted by the middle illumination light source 115A can be divided into four categories. Category one is on axis angle light, such as incoming light ray 1, which happens to travel along the optical axis A and undergoes no propagation angle change upon passing through the optical lens 105.

Category two is low angle incoming light rays which are emitted by the middle illumination light source 115A and pass through the left or right input central portions 135A-B and then respective left or right output body portions 161A-B, and obey the Fresnel equations. Incoming light ray 2 is such a low angle incoming light ray emitted by the middle illumination light source 115A and passes through the right input central portion 135B where incoming light ray 2 is refracted. The refracted incoming light ray 2 then passes through the right output body portion 161B and is refracted once again. Hence, the doubly refracted light ray 2 is effectively steered between a two lens system formed by the right input central portion 135B and the right output body portion 161B.

Category three is high angle incoming light rays which are emitted by the middle illumination light source 115A, pass through the left or right input peripheral portions 140A-B, strike respective left or right output lateral portions 155A-B, and then pass through respective left or right output shoulder portions 162A-B. Incoming light ray 3 is such a high angle incoming light ray emitted by the middle illumination light source 115A and passes through the right input peripheral portion 140B where incoming light ray 3 is refracted. The refracted incoming light ray 3 then strikes the right output lateral portion 155B, where refracted incoming light ray 3 is totally internally reflected (TIR). In this example, the TIR incoming light ray 3 then passes through the right output shoulder portion 162B where the TIR incoming light ray 3 passes through without undergoing any further refraction (e.g., passes straight out without additional steering) or undergoes very minor refraction. It should be understood that the refraction angle depends on the required beam distribution, thus the curve or slope of the output shoulder portion 162B can be adjusted (e.g., upwards, downwards, flat) according to the beam distribution requirement.

Category four is medium angle incoming light rays which are emitted by the middle illumination light source 115A, pass through the left or right input peripheral portions 140A-B and pass through respective left or right output lateral portions 155A-B. Incoming light ray 4 is such a medium angle incoming light ray emitted by the middle illumination light source 115A and passes through the right input peripheral portion 140B where incoming light ray 4 is refracted. The refracted incoming light ray 4 then passes through the right output lateral portion 155B and is refracted once again towards the forwarding direction.

Figure 4:
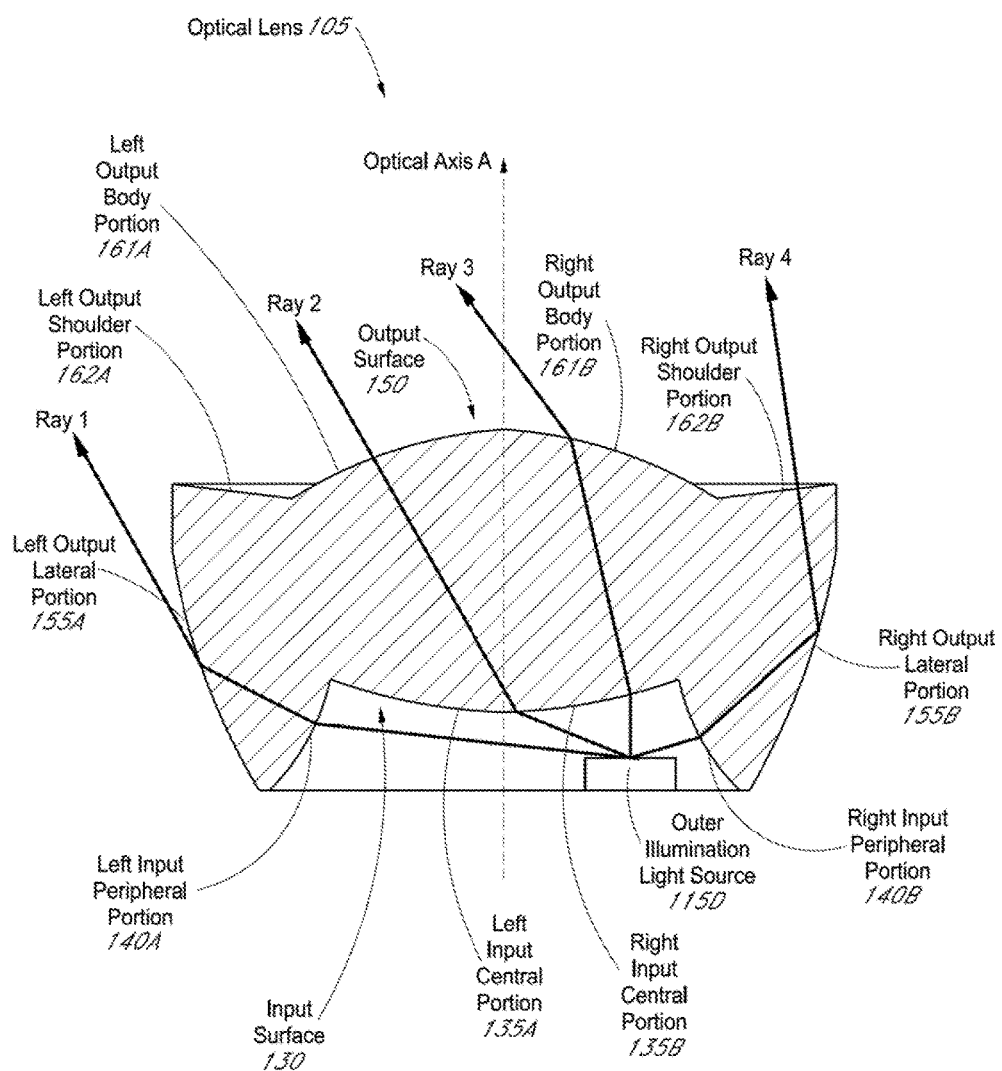
FIG. 4 is another cross-sectional view of the optical lens of FIGS. 1-2 and traces of light rays emitted by an outer illumination light source steered or shaped through the surfaces.

FIG. 4 is another cross-sectional view of the optical lens of FIGS. 1-2 illustrating steering or shaping through aspheric or spheric convex surfaces, for example. Traces of several light rays emitted by a right outer illumination light source 115D through the surfaces of the optical lens 105 are depicted. The optical lens 105 steers the beam distribution for the depicted outer illumination light source 115D.

Outer illumination light source 115D is underneath the optical lens 105 on the side towards the right input peripheral portion 140B, outside of the central area of the input central portion 135 through which the optical axis A passes and the outer illumination light source 115A (not shown) resides. For the outer illumination light source 115D, the optical lens 105 collimates incoming light rays emitted by the outer illumination light source 115D to an asymmetric distribution. As shown, rays emitted by the outer illumination light source 115D can be divided into four categories similar to the middle illumination light source 115A previously described in FIG. 3.

Category one is high angle incoming light rays which are emitted by the left outer illumination light source 115B (not shown) or the right outer illumination light source 115D, pass through the opposing left or right input peripheral portions 140A-B and pass through the opposing left or right output lateral portions 155A-B. Such high angle incoming light rays obey the Fresnel equations. Incoming light ray 1 is such a high angle incoming light ray emitted by the right outer illumination light source 115D and passes through the left input peripheral portion 140A where incoming light ray 1 is refracted. The refracted incoming light ray 1 then passes through the left output lateral portion 155A and is refracted once again towards the forwarding direction.

Category two is medium angle incoming light rays which are emitted by the left outer illumination light source 115B (not shown) or the right outer illumination light source 115D and pass through either the left or right input central portions 135A-B and then the opposing left or right output body portions 161A-B. Incoming light ray 2 is such a medium angle incoming light ray emitted by the right outer illumination light source 115D and passes through the right input central portion 135B where incoming light ray 2 is refracted. The refracted incoming light ray 2 then passes through the left output body portion 161A and is refracted once again. Hence, the doubly refracted light ray 2 is effectively steered between an active two lens system formed by the right input central portion 135B and the left output body portion 161A to the left side of the optical lens 105.

Incoming light ray 3 is in a third category of low angle incoming light rays emitted by the outer illumination light source 115D and is similar to medium angle incoming light ray 2. However, in the instance of incoming light ray 3, the angle is very low, hence the geometry is such that incoming light ray 3 passes through the right input central portion 135B where incoming light ray 3 is refracted like incoming light ray 2, but then the refracted incoming light ray 3 passes through the right output body portion 161B and is refracted once again. In both examples of incoming light rays 2 and 3, the input central portions 135A-B and the output body portions 161A-B, behave as a convex lens. Because both incoming light rays 2 and 3 are off optical axis light, incoming light rays 2 and 3 are collimated to one side of the optical lens 105.

Category four is medium angle incoming light rays which are emitted by the left outer illumination light source 115B (not shown) or the right outer illumination light source 115D away from the middle illumination light source 115A, pass through the respective left or right input peripheral portions 140A-B, strike respective left or right output lateral portions 155A-B, and then pass through respective left or right output shoulder portions 162A-B. Incoming light ray 4 is such a medium angle incoming light ray emitted by the outer illumination light source 115D and passes through the right input peripheral portion 140B where incoming light ray 4 is refracted. The refracted incoming light ray 4 then strikes the right output lateral portion 155B, where refracted incoming light ray 4 is totally internally reflected (TIR). The TIR incoming light ray 4 then passes through the right output shoulder portion 162B where the TIR incoming light ray 4 passes with further refraction.

Figures 5A, 5B, 5C:
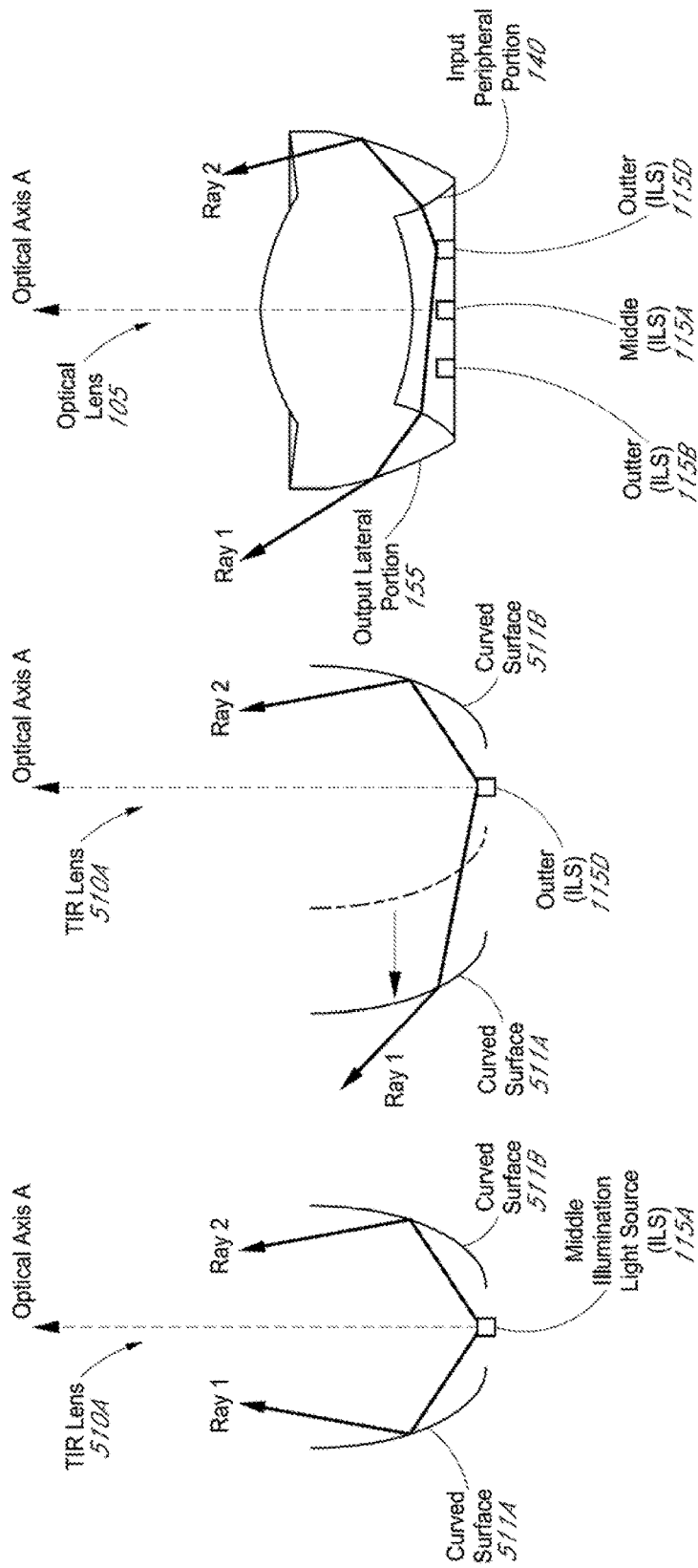
FIG. 5A is a schematic of a total internal reflection (TIR) lens with a middle illumination light source disposed inside the TIR lens and traces of light rays emitted by the middle illumination light source disposed inside the TIR lens.
FIG. 5B is a schematic of the TIR lens of FIG. 5A with an outer illumination light source disposed inside the TIR lens and traces of light rays emitted by the outer illumination light source disposed inside the TIR lens.
FIG. 5C is a schematic of the optical lens of FIGS. 1-2 with middle and outer illumination light sources disposed inside the optical lens and traces of light rays emitted by the middle and outer illumination light sources disposed inside the optical lens.

FIGS. 5A-C describe the process of the passive optical lens design 105, considering a 2-dimensional case as shown in FIG. 5A in which a TIR lens 510A is designed for a middle illumination light source 115A. By shifting one side of the TIR lens 510A surface further away from the optical axis A, a new lens is formed, for which the middle illumination light source 115A becomes the outer illumination light source 115D as shown in FIG. 5B. In FIG. 5C, based on the new optical lens, the new symmetric center is found, which becomes the new optical axis A. By adding an extra opening and top output surface, a passive optical lens 105 is formed.

Differences between the optical lens 105 and a normal TIR lens 510A are demonstrated in the two-dimensional geometry of the cross-sections shown FIGS. 5A-C. FIG. 5A is schematic of a total internal reflection (TIR) lens 510A with a middle illumination light source 115A disposed inside the TIR lens 510A and traces of light rays emitted by the middle illumination light source 115A disposed inside the TIR lens 510A. FIG. 5B is schematic of the TIR lens 510A of FIG. 5A with a right outer illumination light source 115D disposed inside the TIR lens 510A and traces of light rays emitted by the right outer illumination light source 115D disposed inside the TIR lens 510A. FIG. 5C is schematic of the optical lens of FIGS. 1-2 with the middle illumination light source 115A, left outer illumination light source 115B, and right outer illumination light source 115D disposed inside the optical lens 510A and traces of light rays emitted by the right outer illumination light source 115B disposed inside the optical lens 510A.

The TIR lens 510A is shown in FIG. 5A and, during normal operation the middle illumination light source 115A is located near or at the focus of the TIR lens 510A for the TIR lens 510A to achieve total internal reflection and collimate the incoming light from the middle illumination light source 115A. Thus, in FIG. 5A the middle illumination light source 115A is at the focus of the curved surfaces 511A-B. Since incoming light ray 1 and incoming light ray 2 are travelling at an angle of incidence larger than the critical angle for refraction, incoming light ray 1 is reflected off the curved surface 511A and incoming light ray 2 is reflected off the curved surface 511B, which obeys the law of reflection. Accordingly, incoming light rays 1 and 2 are both collimated by the TIR lens 510A and bend away from the normal, instead of bending towards the normal and passing through the curved surfaces 511A-B.

Moving to FIG. 5B, now the right outer illumination light source 115D is located within the TIR lens 510A. However, the right outer illumination light source 115D is outside of the focus of the TIR lens 510A and is not located at or near the focus of the TIR lens 510A. Most of the light from the right outer illumination light source 115D is not collimated through total internal reflection by the optical lens 510A. Incoming light ray 1 is refracted by curved surface 511A to bend towards the normal to pass through the curved surface 511A. Meanwhile incoming light ray 2 is TIR off the curved surface 511B to bend away from the normal.

Continuing to FIG. 5C, now the middle illumination light source 115A is surrounded by the right outer illumination light source 115D on the right side and the left outer illumination light source 115B on the left side. The middle illumination light source 115A and outer illumination light sources 115B and 115D are located within the optical lens 105 with middle illumination light source 115A. The optical lens 105 is designed to achieve an asymmetric beam pattern by finding the center axis for a new curve to achieve total internal reflection for incoming light rays emitted by the outer illumination light sources 115B and 115D. The new curve is rotated around the center axis, to achieve a three-dimensional structure, which generates the output lateral portion 155 of the optical lens 105. In this case, incoming light ray 2 from the right outer illumination light source 115D is refracted by the right side of the input peripheral portion 140, then strikes (e.g., hits) the right side of the output lateral portion 155 and is totally internally reflected. On the other hand, incoming light ray 1 from the right outer illumination light source 115D is refracted by the left side of the input peripheral portion 140, then strikes (e.g., hits) the left side of the output lateral portion 155 and is refracted to bend toward the normal and pass through like ray 1 in FIG. 4.

Figure 6:
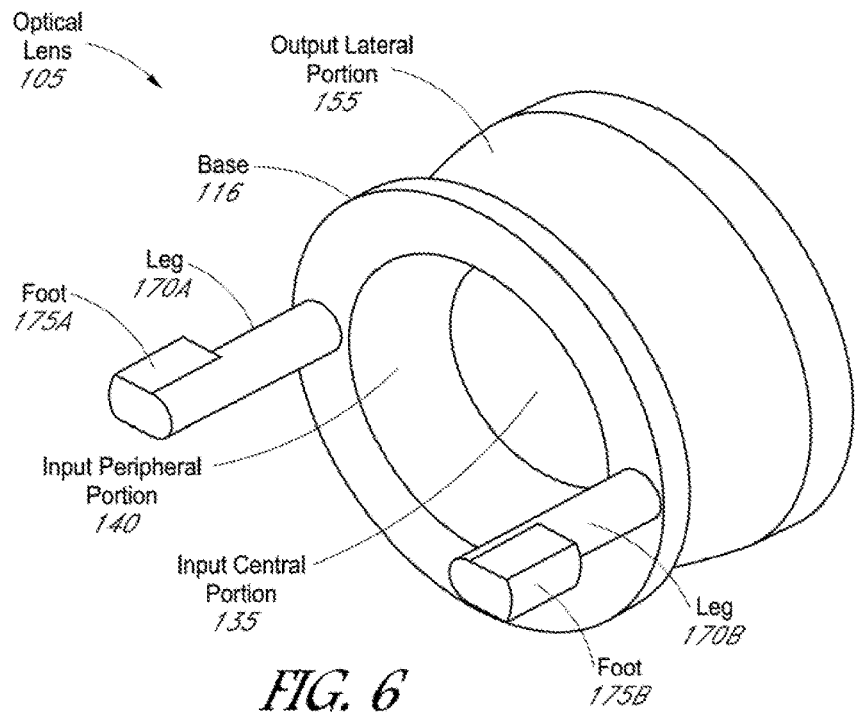
FIG. 6 is a bottom isometric view of the optical lens of FIG. 1 depicting an output lateral portion, an input peripheral portion, an input central portion, and a base with attached legs and feet.
Figure 7:
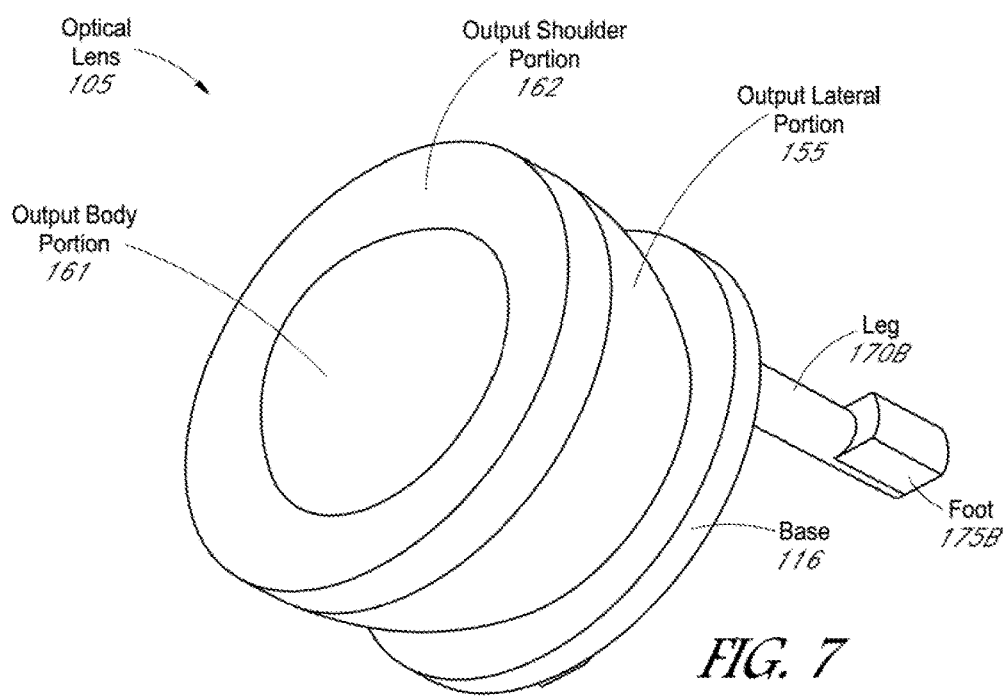
FIG. 7 is a top isometric view of the optical lens of FIGS. 1 and 6.

FIG. 6 is a bottom isometric view of the optical lens 105 of FIG. 1 depicting the output lateral portion 155, the input peripheral portion 140, the input central portion 135, and the base 116 with attached legs 170A-B and feet 175A-B. It should be understood that the base 116, legs 170A-B and feet 175A-B are mechanical support structures for the optical lens 105 and typically do not have an optical function. FIG. 7 is a top isometric view of the optical lens of FIGS. 1 and 6 also showing the output body portion 161 and the output shoulder portion 162.

The example of FIGS. 6-7 illustrates a substantially circular profile for the base 116 of the optical lens 105 like that shown in FIG. 1 and the cross-sections depicted in FIGS. 3, 4, and 5C. However, the shape of the base 116 of the optical lens 105 can have a variable profile depending on the intended application. For example, an elongated rectangular base 116 may be utilized for the optical lens 205 in FIG. 2, which can be suitable for an illumination light source matrix 215 which includes a large number of illumination light sources. In some examples, the base 116 may have a different shape than the optical lens 105, 205 (e.g., not have a circular or rectangular outline).

The shape and size of the optical lens 105, 205 can vary depending on the size of the lighting device or luminaire incorporating the optical lens 105, 205 and the number and size of the illumination light sources disposed under the optical lens 105, 205. The size and layout of pixel light emitters in the lighting device or luminaire incorporating optical lens 105, 205 can also affect the shape and size of the optical lens 105, 205.

Figure 8:
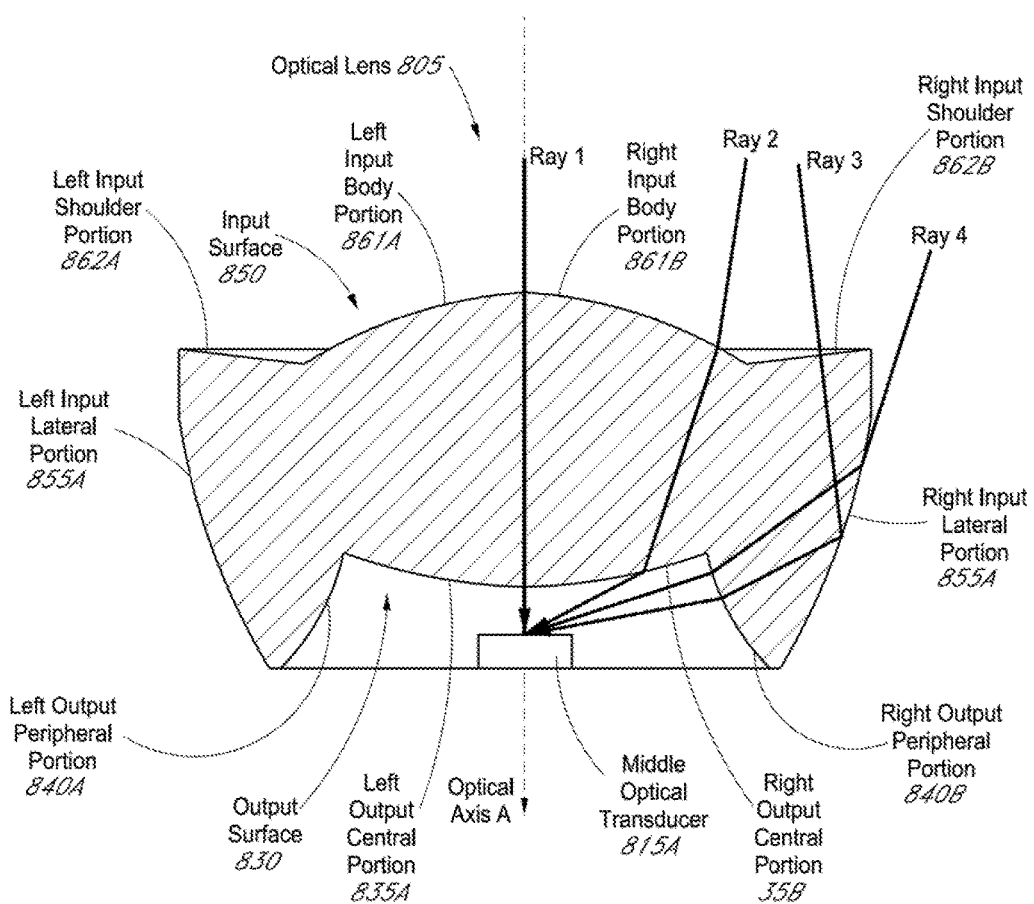
FIG. 8 is a cross-sectional view of the optical lens like that of FIG. 3, but illustrating light rays steered to a middle optical-to-electrical transducer through the surfaces to produce an electrical signal.
Figure 9:
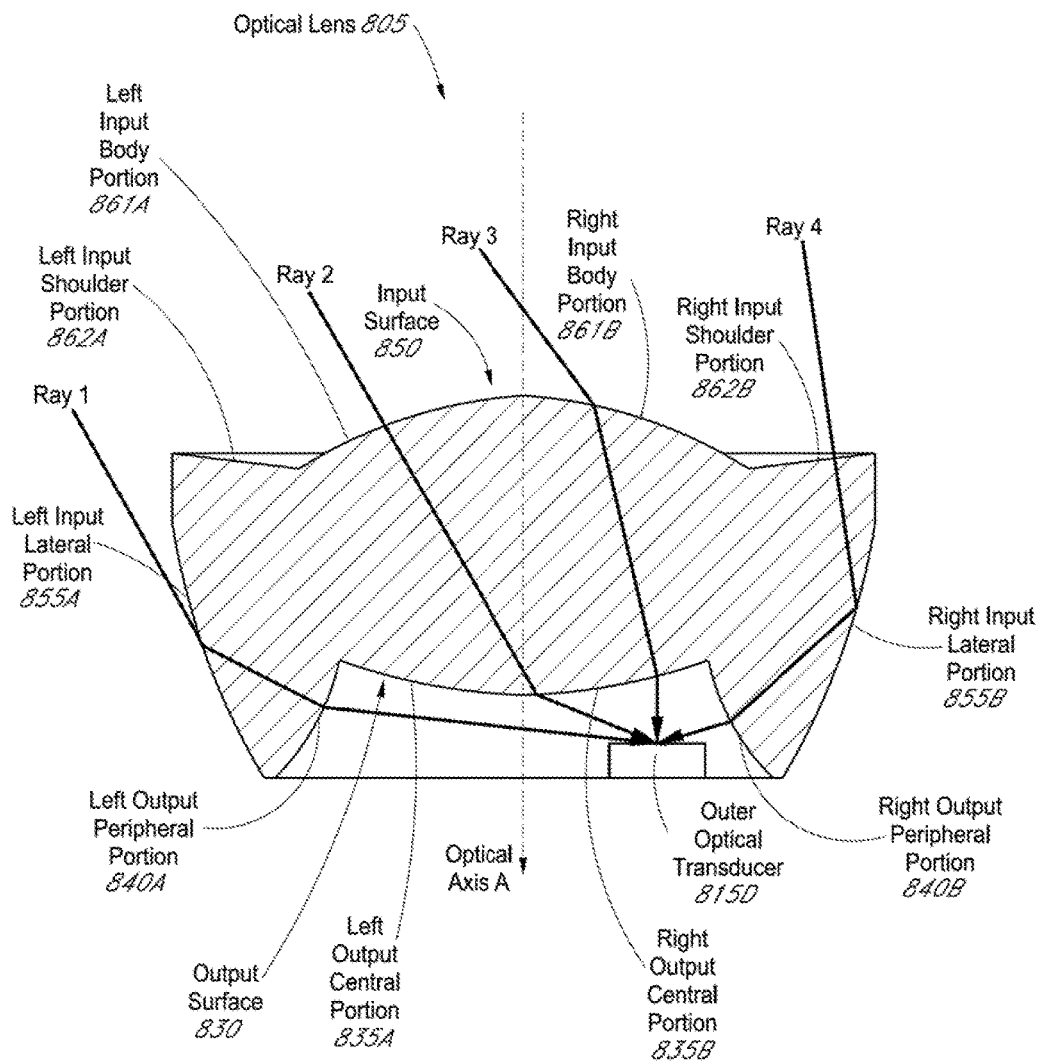
FIG. 9 is a cross-sectional view of the optical lens like that of FIG. 4, but illustrating light rays received by an outer optical-to-electrical transducer through the surfaces to produce an electrical signal.

FIG. 8 is a cross-sectional view of the optical lens 805 like that of FIG. 3, but illustrating light rays to be optically sensed are steered to a middle optical transducer 815A through the surfaces to produce an electrical signal. Traces of several light rays received by the middle optical transducer 815A through the surfaces of the optical lens 805 are depicted which drive the middle optical transducer 815A. The optical lens 805 steers the beam distribution to the depicted middle optical transducer 815A. A transducer is a device that converts between optical and electrical signals. Hence, in the previous examples, the illumination light sources are electrical transducers in which electrical power is used to emit light. In the examples of FIGS. 8-9, the optical transducers convert received incoming light into an electrical signal, for example, a photodetector or photodiode for a camera, which takes light as a signal and produces an electrical signal.

The optical lens 805 includes an input surface 850 and an output surface 830 coupled to direct light to the middle optical transducers 815A. The input surface 850 includes an input lateral portion 855A-B, an input shoulder portion 862A-B, and an input body portion 861A-B. The input lateral portion 855A-B extends towards the optical transducer(s) 815A, curves towards the input peripheral portion 840A-B, and intersects the output shoulder portion 862A-B. The input shoulder portion 862 surrounds the input body portion 861A-B. The input body portion 861A-B curves outwards from the input shoulder portion 862A-B. The output surface 830 includes an output peripheral portion 840A-B and an output central portion 835A-B. The output peripheral portion 840A-B curves around the optical transducers 815A-B towards the input central portion 835A-B. The output central portion 835A-B curves towards the optical transducer(s) 815A.

In one example, incoming light rays first pass through the input surface 850 where the incoming light rays undergo refraction. After passing through the input surface 850, the refracted incoming light rays then pass through the output surface 830 to be received by at least one the optical transducers 815A.

Like FIG. 3, a cross-section of the optical lens 805 is illustrated in which an optical axis A passes through a middle of the output central portion 835 and the input body portion 861 of the optical lens 805 and bisects the cross-section into left and right sides. Hence, the left side of the cross-section includes a left input lateral portion 855A, a left input shoulder portion 862A, a left input body portion 861A, a left output peripheral portion 840A, and a left output central portion 835A. The right side of the cross-section includes a right input lateral portion 855B, a right input shoulder portion 862B, a right input body portion 861B, a right output peripheral portion 140B, and a right output central portion 835B.

As shown, the optical lens is positioned over the optical transducers, hence the middle optical transducer 815A is in the center underneath the optical lens 805. For the middle optical transducer 815A, the optical lens 805 behaves like a collimating lens for incoming light rays. As shown, rays received by the middle optical transducer 815A can be divided into four categories. Category one is no angle light (on axis light), such as incoming light ray 1, which happens to travel along the optical axis A and undergoes no propagation angle change upon passing through the optical lens 805.

Category two is low angle incoming light rays that pass through the left or right input body portions 861A-B, pass through the respective left or right output central portions 835A-B, and then are received by the middle optical transducer 815A, which obey the Fresnel equations. Incoming light ray 2 is such a low angle incoming light ray which passes through the right input body portion 861B where incoming light ray 2 is refracted. The refracted incoming light ray 2 then passes through the right output central portion 835B and is refracted once again to be received by the middle optical transducer 815A. Hence, the doubly refracted light ray 2 is effectively steered between an active two lens system formed by the right input body portion 861B and the right output central portion 835B.

Category three is medium angle incoming light rays that pass through the left or right input shoulder portions 862A-B, strike respective left or right input lateral portions 855A-B, pass through the respective left or right output peripheral portions 840A-B, and then are received by the middle optical transducer 815A. Incoming light ray 3 is such a medium angle incoming light ray which passes through the right input shoulder portion 862B where incoming light ray 3 passes through with refraction. The incoming light ray 3 then strikes the right input lateral portion 855B, where incoming light ray 3 is totally internally reflected (TIR). The TIR incoming light ray 3 then passes through the right input peripheral portion 840B where incoming light ray 3 is refracted to be received by the middle optical transducer 815A.

Category four is high angle incoming light rays that pass through the left or right input lateral portions 855A-B, pass through the respective left or right output peripheral portions 840A-B, and then are received by the middle optical transducer 815A. Incoming light ray 4 is such a high angle incoming light ray which passes through the right input lateral portion 855B where incoming light ray 4 is refracted. The refracted incoming light ray 4 then passes through the right input lateral portion 840B and is refracted once again to be received by the middle optical transducer 815A.

FIG. 9 is a cross-sectional view of the optical lens 805 like that of FIG. 4, but illustrating light rays steered to a right outer optical transducer 815D through the surfaces to produce an electrical signal. Traces of several light rays received by the right outer optical transducer 815D through the surfaces of the optical lens 805 are depicted. The optical lens 805 steers the beam distribution to the depicted right outer optical transducer 815D.

Outer optical transducer 815D is underneath the optical lens 805 on the side towards the right output peripheral portion 840B, outside of the central area of the output central portion 835 through which the optical axis A passes and the middle optical transducer 815A (not shown) resides. For the outer optical transducer 815D, the optical lens 805 behaves like a collimating lens for incoming light rays. The optical lens 805 steers the beam distribution to the depicted outer optical transducer 815D. As shown, rays received by the outer optical transducer 815D can be divided into four categories similar to the middle optical transducer 815A previously described in FIG. 8.

Category one is high angle incoming light rays that pass through the left or right input lateral portions 855A-B, pass through the respective left or right output peripheral portions 840A-B, and the optical axis A passes and the middle, then are received by the opposing left optical transducer 815B (not shown) or the opposing right outer optical transducer 815D. Such high angle incoming light rays obey the Fresnel equations. Incoming light ray 1 is such a high angle incoming light ray which passes through the left input lateral portion 855A where incoming light ray 1 is refracted. The refracted incoming light ray 1 then passes through the left output peripheral portion 840A where incoming light ray 1 is refracted to be received by the right outer optical transducer 815D.

Category two is medium angle incoming light rays that pass through the left or right input body portions 861A-B, pass through the left or right output central portions 835A-B, and then are received by the right outer optical transducer 815D, which obey the Fresnel equations. Incoming light ray 2 is such a medium angle incoming light ray which passes through the left input body portion 861A where incoming light ray 2 is refracted. The refracted incoming light ray 2 then passes through the right input central portion 835B and is refracted once again. Hence, the doubly refracted light ray 2 is effectively steered between an active two lens system formed by the left input body portion 861A and the right output central portion 135B to the right side of the optical lens 805.

Incoming light ray 3 is in a third category of low angle incoming light rays received by the right outer optical transducer 815D and is similar to medium angle incoming light ray 2. However, in the instance of incoming light ray 3, the angle is very low, hence the geometry is such that incoming light ray 3 passes through the right input body portion 861B where incoming light ray 3 is refracted like incoming light ray 2, but then the refracted incoming light ray 3 passes through the right output central portion 835B and is refracted once again. In both examples of incoming light rays 2 and 3, the input body portions 861A-B and the output central portions 835A-B, behave as a convex lens. Because both incoming light rays 2 and 3 are off optical axis light, incoming light rays 2 and 3 are collimated to one side of the optical lens 105.

Category four is medium angle incoming light rays that pass through left or right input shoulder portions 862A-B, strike respective left or right input lateral portions 855A-B, pass through the respective left or right output peripheral portions 840A-B, and then are received by the left outer optical transducer 815B (not shown) or the right outer optical transducer 815D. Incoming light ray 4 is such a medium angle incoming light ray which passes through the right input shoulder portion 862B with refraction. The incoming light ray 4 then strikes the right input lateral portion 855B, where incoming light ray 4 is totally internally reflected (TIR). The TIR incoming light ray 4 then passes through the right output peripheral portion 840B where the TIR incoming light ray 4 is refracted to be received by the right outer optical transducer 815D.

Figure 10:
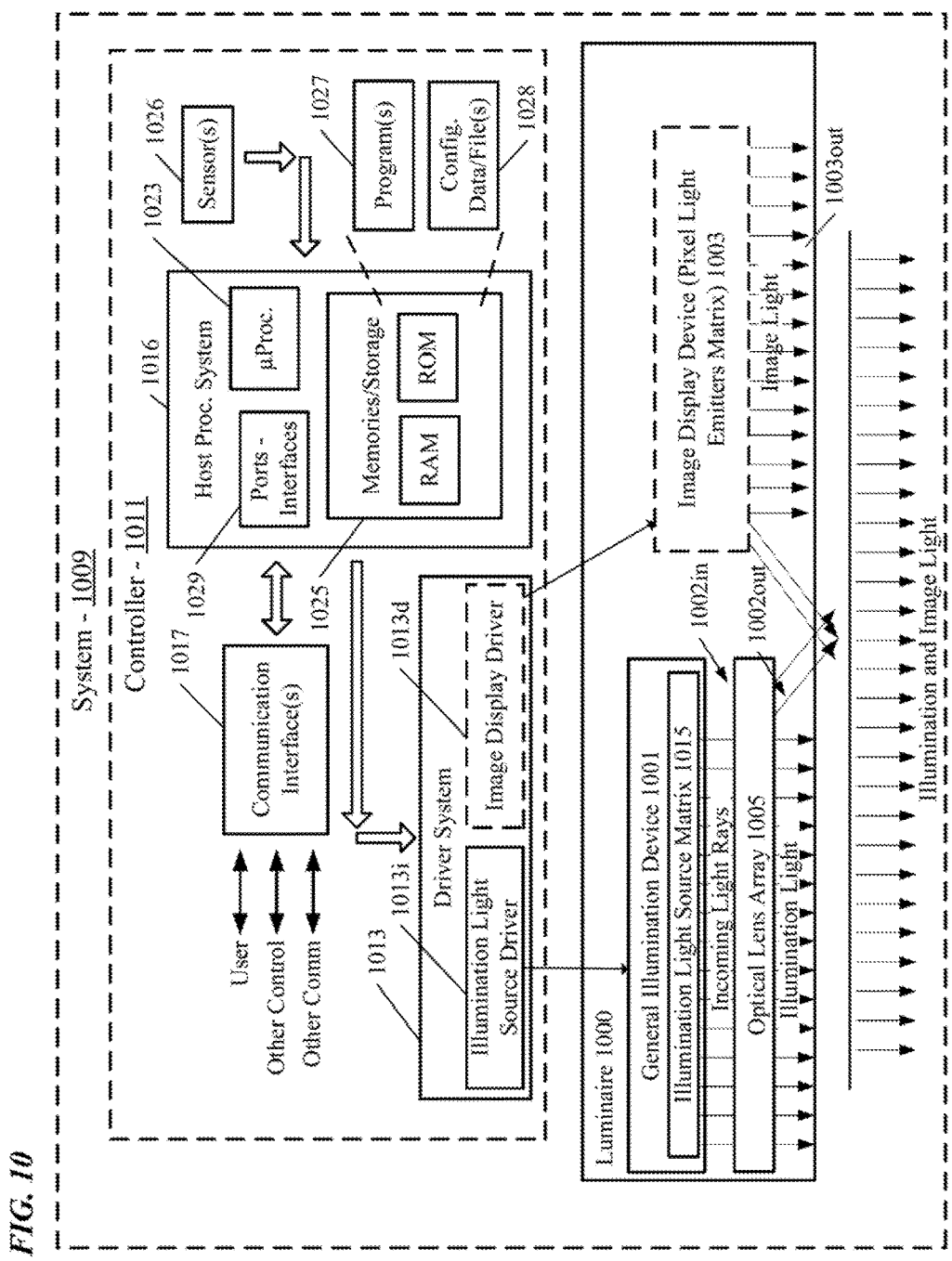
FIG. 10 is a functional block diagram of an example of a system in which a luminaire includes a lighting device that includes general illumination and image display and a coupled optical lens array.

FIG. 10 illustrates an example of a luminaire 1000 as part of a controllable lighting system 1009 that also includes a controller 1011. In the simplified block diagram example, the luminaire 1000 includes a general illumination device 1001, an optical lens array 1005, and an image display 1003. Elements 1001, 1003, and 1005 are collocated or integrated together into a sandwiched unit to form an array of combined lighting elements; and devices 1001 and 10003 are controlled by the respective control signals received from a driver system 1013. It should be understood that general illumination device 1001 and image display device 1003 may be on the same lighting circuit board with the optical lens array 1005 coupled thereto; or on a separate illumination lighting circuit board with the optical lens array 1005 coupled thereto and a separate display circuit board, respectively. It should be understood that in some examples, the luminaire can only be for illumination lighting applications and does not include the image display device 1003 and the image display driver 1013d. In such examples, after passing through the optical lens array 1005, only the shaped or steered illumination lighting emerges via the output surface of the luminaire 1000 and there is no display image 1003 out.

General illumination device 1001 provides illumination lighting in response to lighting control signals received from the driver system 1013i, for example, based on an illumination application (stored as program(s) 1027). In an example, the general illumination device 1001 includes layers forming an illumination light source matrix 1015 comprised of light emitting diodes (LEDs). The LEDs extend at least substantially across a panel of the general illumination device 1001 forming a matrix of illumination pixels extending at least substantially across the panel area(s) of the general illumination device 1001. Illumination light rays emitted by the illumination pixels are coupled to one of the respective elements of the optical lens array 1005.

The transparent image display device 1003 provides image light in response to image control signals received from the driver system 1013d and can be formed on the same panel as the general illumination device 1001. In addition or alternatively, the image data may be provided to the image display device 1003 from an external source(s) (not shown), such as a remote server or an external memory device via one or more of the communication interfaces 1017 and the host processing system 1016.

The illumination light source matrix 1015 is comprised of one or more illumination light sources. Although shown separately for ease of illustration in the block diagram, the general illumination device 1001, including the illumination light source matrix 1015, may be coupled to or integrated into the body of the image display device 1003 and/or coupled to or integrated in/with the optical lens array 1005. An example of a transmissive illumination light source 1015 is a layer of one or a larger number of OLED type emitters. Other examples include arrays of inorganic LED type emitters.

As noted above, the illumination light source matrix 1015 is an array of one or more illumination light sources controllable to emit artificial illumination lighting. Illumination light source matrix 1015 generates illumination light for emission through an output surface of the general illumination device 1001 (downward in the illustrated example) as light for an illumination application of the luminaire 1000. The general illumination device 1001, including for example the illumination light source matrix 1015, is configured to output sufficient visible light to support the illumination application of the luminaire 1000, for example, to have an intensity and/or other characteristic(s) that satisfy an industry acceptable performance standard for a general lighting application without necessarily requiring concurrent light output from the image display device 1003.

The illumination light source matrix 1015 is coupled to or integrated into the body of the luminaire 1000, as discussed in more detail earlier, via at least one element of the optical lens array 1005. The incoming light rays of illumination light from the illumination light source matrix 1015 is output from the general illumination device 1001 into the input surface 1002in of the optical lens array 1005 and then emerges through the output surface 1002out of the optical lens array 1005 with an appropriately shaped or steered beam distribution. For each optical lens element of the pens lens array 1005, the portion of the input surface 1002in is optically coupled to a respective illumination light source to steer or shape illumination lighting from the respective illumination light source. For each optical lens array 1005 element, the portion of the output surface 1002out opposes the input surface 1002in.

After passing through the optical lens array 1005, the shaped or steered illumination lighting enters mixes with the display image 1003out from the image display device 1003 and then emerges from via the same output surface of the luminaire 1000.

Image display device 1003 is an emissive type display device controllable to emit light of a selected image, e.g., as a still image or a video frame. The image display device 1003 includes a pixel matrix including an array of pixel light emitters and is also transmissive with respect to light from the illumination light source matrix 1015 of the general illumination device 1001. Each pixel light emitter of image display device 1003 is controllable to emit light for a respective pixel of the displayed image.

Each of the pixel light emitters of the image display device 1003 and each of the illumination light sources of the illumination light source matrix 1015 can be individually driven and controlled. Each optical lens of the optical lens array 1005 can be structured to provide a one-to-one correspondence between a respective illumination light source and a respective pixel light emitter. It should be understood that optical lens elements of the optical lens array 1005 can be coupled to multiple illumination light sources of the illumination light source matrix 1015 and optionally pixel light emitters to provide beam shaping or steering.

The drawing (FIG. 10) also shows the inclusion of the luminaire 1000 in a system 1009, together with a suitable controller 1011. As shown in FIG. 10, the controller 1011 includes a driver system 1013 coupled to the luminaire 1000 and a host processing system 1016. The controller 1011 may also include one or more communication interfaces 1017 and/or one or more sensors 1026.

The controllable luminaire 1000 produces general illumination lighting as well as visible light of an image display output in response to control signals received from the driver system 1013. For that purpose, the example of the driver system 1013 includes an illumination light source driver 1013i configured and coupled to supply suitable power to drive the particular implementation of the illumination light source matrix 1015, and the example of the driver system 1013 includes display driver 1013d configured and coupled to supply image display signals to the particular implementation of the image display device 1003. Although shown separately, the drivers 1013i, 1013d of the system 1013 may be formed by unified driver circuitry.

The image display device 1003 may be either a commercial-off-the-shelf image display or an enhanced display or the like specifically adapted for use in the luminaire 1000. The image display device 1003 is configured to present an image. The presented image may be a real scene, a computer generated scene, a single color, a collage of colors, a video stream, animation, a Trompe-l'oeil design intended to create an illusion of a three-dimensional object, or the like. The general illumination device 1001 may be an otherwise standard general illumination system, if suitably transmissive, which is co-located with and optically coupled to an output of the image display device 1003. Several examples of the luminaire 1000 in which the lighting device and/or the display are specifically configured for use together in a luminaire like 1000 are discussed herein.

FIG. 10 also provides an example of an implementation of the high layer logic and communications elements to control luminaire operations to provide selected illumination light, e.g., for a general illumination application, and to provide a selected display image output. As shown, the controller 1011 includes a host processing system 1016, one or more sensors 1026 and one or more communication interface(s) 1017. Other implementations of the circuitry of the controller 1011 may be utilized. For the purpose of illumination and display operation, the circuitry of the controller 1011, in the example, is coupled to the illumination light source matrix 1015 and the image display device 1003 to drive and control operation of the illumination light source matrix 1015 and the image display device 1003. The circuitry of the controller 1011 may be configured to operate the illumination light source matrix 1015 to generate the illumination light at least during an illumination state of the luminaire 1000, and to operate the image display device 1003 to emit the light of the image at least during an image display state of the luminaire 1000.

The controller 1011 may implement a number of different illumination/image display state configurations. For example, the circuitry of the controller 1011 is configured to implement the illumination state of the luminaire 1000 and the image display state of the luminaire 1000 at the same time (i.e., simultaneously). For example, illumination light source matrix 1015 generates illumination light concurrently with emission of the light of the image by the image display device 1003. Or the combined illumination and image light output, for example, could provide an even higher overall intensity or coloring tuning for a specific lighting application. The color tuning mixes the colors of the image display device 1003 and the illumination light source matrix 1015 so that a user can easily change color temperature of the illumination light. Alternatively, the circuitry of the controller 1011 can also drive the illumination state and the image display state at different times, for example, as distinct, mutually exclusive states.

The host processing system 1016 provides the high level logic or "brain" of the controller 1011 and thus of the system 1009. In the example, the host processing system 1016 includes memories/storage 1025, such as a random access memory and/or a read-only memory, as well as programs 1027 stored in one or more of the memories/storage 1025. The programming 1027, in one example, configures the system 1009 to implement two or more of various display and illumination states of the controlled luminaire 1000, as outlined above. As an alternative to distinct states, the programming 1027 may configure the system 1009 to implement a step-wise or substantially continuous adjustment of the relative intensities of the illumination light and image display light outputs of the controlled luminaire 1000, encompassing settings to achieve the relative intensity levels of the states discussed above.

The memories/storage 1025 may also store various data, including luminaire configuration information 1028 or one or more configuration files containing such information, in addition to the illustrated programming 1027. The host processing system 1016 also includes a central processing unit (CPU), shown by way of example as a microprocessor (µP) 1023, although other processor hardware may serve as the CPU.

The ports and/or interfaces 1029 couple the processor 1023 to various elements of the lighting system 1009 logically outside the host processing system 1016, such as the driver system 1013, the communication interface(s) 1017 and the sensor(s) 1026. For example, the processor 1023 by accessing programming 1027 in the memory 1025 controls operation of the driver system 1013 and thus operations of the luminaire 1000 via one or more of the ports and/or interfaces 1029. In a similar fashion, one or more of the ports and/or interfaces 1029 enable the processor 1023 of the host processing system 1016 to use and communicate externally via the communication interface(s) 1017; and the one or more of the ports 1029 enable the processor 1023 of the host processing system 1016 to receive data regarding any condition detected by a sensor 1026, for further processing.

In the operational examples, based on its programming 1027, the processor 1023 processes data retrieved from the memory 1023 and/or other data storage, and responds to light output parameters in the retrieved data to control the light generation by the general illumination device 1001, particularly the illumination light source matrix 1015. The light output control also may be responsive to sensor data from a sensor 1026. The light output parameters may include light intensity and light color characteristics of light from light sources. The light output parameters may also control modulation of the light output, e.g., to carry information on the illumination light output of the luminaire 1000. The configuration file(s) 1028 may also provide the image data, which the host processing system 1016 uses to control the display driver 1013d and thus the light emission from the image display device 1003.

As noted, the host processing system 1016 is coupled to the communication interface(s) 1017. In the example, the communication interface(s) 1017 offer a user interface function or communication with hardware elements providing a user interface for the system 1009. The communication interface(s) 1017 may communicate with other control elements, for example, a host computer of a building control and automation system (BCAS). The communication interface(s) 1017 may also support device communication with a variety of other equipment of other parties having access to the lighting system 1009 in an overall/networked lighting system encompassing a number of systems 1009, e.g., for access to each system 1009 by equipment of a manufacturer for maintenance or access to an on-line server for downloading of programming instruction or configuration data for setting aspects of luminaire operation.

As outlined earlier, the host processing system 1016 also is coupled to the driver system 1013. The driver system 1013 is coupled to the general illumination device 1001, particularly the illumination light source matrix 1015, and the image display device 1003. Although the driver system 1013 may be a single integral unit or implemented in a variety of different configurations having any number of internal driver units, the example of system 1013 includes separate general illumination source driver circuit 1013i and image display driver circuit 11013d. The separate drivers may be circuits configured to provide signals appropriate to the respective type of illumination light source matrix 1015 and/or display 1003 utilized in the particular implementation of the luminaire 1000, albeit in response to commands or control signals or the like from the host processing system 1016.

The host processing system 1016 and the driver system 1013 provide a number of control functions for controlling operation of the luminaire 1000, including in the illumination and image display states discussed earlier. In a typical example, execution of the programming 1027 by the host processing system 1016 and associated control via the driver system 1013 configures the luminaire 1000 to perform functions, including functions to operate the illumination light source matrix 1015 to provide light output from the lighting system 1009 and to operate the image display device 1003 to output a selected image, e.g., based on the lighting device configuration information 1028.

In an example of the operation of the luminaire 1000, the processor 1023 receives a configuration file 1028 via one or more of communication interfaces 1017. The processor 1023 may store, or cache, the received configuration file 1028 in storage/memories 1025. The file may include image data, or the processor 1023 may receive separate image data via one or more of communication interfaces 1017. The image data may be stored, along with the received configuration file 1028, in storage/memories 1025. Alternatively, image data (e.g., video) may be received as streaming data and used to drive the image display device 1003 in real-time.

The image display driver 1013d may deliver the image data directly to the image display device 1003 for presentation or may have to convert the image data into a signal or data format suitable for delivery to the image display device 1003. For example, the image data may be video data formatted according to compression formats, such as H. 264 (MPEG-4 Part 10), HEVC, Theora, Dirac, RealVideo RV40, VP8, VP9, or the like, and still image data may be formatted according to compression formats such as Portable Network Group (PNG), Joint Photographic Experts Group (JPEG), Tagged Image File Format (TIFF) or exchangeable image file format (Exif) or the like. For example, if floating point precision is needed, options are available, such as OpenEXR, to store 32-bit linear values. In addition, the hypertext transfer protocol (HTTP), which supports compression as a protocol level feature, may also be used. For at least some versions of the image display device 1003 offering a low resolution image output, higher resolution source image data may be down-converted to a lower resolution format, either by the host processing system 1016 or by processing in the circuitry of the driver 1013d.

For illumination control, the configuration information in the configuration file 1028 may specify operational parameters of the controllable general illumination device 1001, such as light intensity, light color characteristic, and the like for light from the illumination light source matrix 1015. Configuration file 1028 may also specify which of the illumination light sources in the illumination light source matrix 1015 to turn off, on, or dim (e.g., left outer, middle, or right outer) along with light intensity and color setting to achieve particular beam angles and lighting distributions via the passive optical lens 105, 205. The processor 1023 by accessing programming 1027 and using software configuration information 1028, from the storage/memories 1025, controls operation of the driver system 1013, and through that driver 1013*i* controls the illumination light source matrix 1015, e.g., to achieve a predetermined illumination light output intensity and/or color characteristic for a general illumination application of the luminaire 1000, including settings for the illumination light source matrix 1015 appropriate to the current one of the luminaire states discussed earlier.

A software configurable lighting system such as 1009 may be reconfigured, e.g., to change the image display output and/or to change one or more parameters of the illumination light output, by changing the corresponding aspect(s) of the configuration data file 1028, by replacing the configuration data file 1028, or by selecting a different file from among a number of such files already stored in the data storage/memories 1025.

In other examples, the lighting system 1009 may be programmed to transmit information on the light output from the luminaire 1000. Examples of information that the system 1009 may transmit in this way include a code, e.g., to identify the luminaire 1000 and/or the lighting system 1009 or to identify the luminaire location. Alternatively or in addition, the light output from the luminaire 1000 may carry downstream transmission of communication signaling and/or user data. The information or data transmission may involve adjusting or modulating parameters (e.g., intensity, color characteristic or the like) of the illumination light output of the general illumination device 1001 or an aspect of the light output from the image display device 1003. Transmission from the image display device 1003 may involve modulation of the backlighting of the particular type of display. Another approach to light based data transmission from the display 1003 may involve inclusion of a code representing data in a portion of a displayed image, e.g., by modulating individual emitter outputs. The modulation or image coding typically would not be readily apparent to a person in the illuminated area observing the luminaire operations but would be detectable by an appropriate receiver. The information transmitted and the modulation or image coding technique may be defined/controlled by configuration data or the like in the memories/storage 1025. Alternatively, user data may be received via one of the communication interface(s) 1017 and processed in the controller 1011 to transmit such received user data via light output from the luminaire 1000.

Although specially configured circuitry may be used in place of microprocessor 1023 and/or the entire host processing system 1016, the drawing depicts an example of the controller 1011 in which functions relating to the controlled operation of the system 1009, including operation of the luminaire 1000, may be implemented by the programming 1027 and/or configuration data 1028 stored in a memory device 1025 for execution by the microprocessor 1023. The programming 1027 and/or data 1028 configure the processor 1023 to control system operations so as to implement functions of the system 1009 described herein.

Aspects of the software configurable lighting system 1009 example therefore include "products" or "articles of manufacture" typically in the form of software or firmware that include executable code of programming 1027 and/or associated configuration data 1028 that is/are carried on or embodied in a type of machine readable medium. "Storage" type media include any or all of storage devices that may be used to implement the memory 1025, any tangible memory of computers or the like that may communicate with the system 1009 or associated modules of such other equipment. Examples of storage media include but are not limited to various semiconductor memories, tape drives, disk drives and the like, which may provide non-transitory storage at any time for the software or firmware programming 1027 and/or the configuration data 1028. All or portions of the programming and/or data may at times be communicated through the Internet or various other telecommunication networks. Such communications, for example, may enable loading of the programming and/or data from a computer or the like into the host processing system 1016 of the controller 1011, for example, from a management server or host computer of the lighting system service provider into a lighting system 1009. Thus, another type of media that may bear the programming 1027 and/or the data 1028 includes optical, electrical and electromagnetic waves, such as used across physical interfaces between local devices, through wired and optical landline networks and over various airlinks. The physical elements that carry such waves, such as wired or wireless links, optical links or the like, also may be considered as media bearing the software. As used herein, unless restricted to non-transitory, tangible or "storage" media, terms such as computer or machine "readable medium" refer to any medium that participates in providing instructions to a processor for execution.

Apparatuses implementing functions like those of configurable lighting system 1009 may take various forms. In some examples, some components attributed to the lighting system 1009 may be separated from the general illumination device 1001 and image display device 1003 of the luminaire 1000. For example, a lighting system 1009 may have all of the above hardware components on or within a single hardware platform as shown in FIG. 10 or in different somewhat separate units. In a particular example, one set of the hardware components may be separated from one or more instances of the controllable luminaire 1000, e.g., such that one host processing system 1016 may run several luminaires 1000 each at a somewhat separate location wherein one or more of the luminaires 1000 are at a location remote from the one host processing system 1016. In such an example, a driver system 1013 may be located near or included in a combined platform with each luminaire 1000. For example, one set of intelligent components, such as the microprocessor 1023, may control/drive some number of driver systems 1013 and associated controllable luminaires 1000. Alternatively, there may be one overall driver system 1013 located at or near the host processing system 1016 for driving some number of luminaires 1000. It also is envisioned that some lighting devices may not include or be coupled to all of the illustrated elements, such as the sensor(s) 1026 and the communication interface(s) 1017. For convenience, further discussion of the lighting system 1009 of FIG. 10 will assume an intelligent implementation of the lighting system 1009 that includes at least the illustrated components.

In addition, the luminaire 1000 of each lighting device 1011 is not size restricted. For example, each luminaire 1000 may be of a standard size, e.g. 2-feet by 2-feet (2×2), 2-feet by 4-feet (2×4), or the like, and arranged like tiles for larger area coverage. Alternatively, one luminaire 1000 may be a larger area device that covers a wall, a part of a wall, part of a ceiling, an entire ceiling, or some combination of portions or all of a ceiling and wall.

Lighting equipment like that disclosed the examples of FIG. 10, may be used with various implementations of the luminaire 1000. Although several examples of the luminaire implementations have been briefly discussed above, it may be helpful to consider some examples in more detail.

As shown in FIG. 11, the combined matrix 1114 of the luminaire includes an appropriate circuit board 1142. A combination of emitters 1144 are mounted on the board 1142 at each of a number of pixel emission points 1144 of the combined matrix 1144. As shown in the enlarged example of FIG. 12, the emitters at each such point of the matrix include five white light illumination light sources 120A-E for illumination light generation positioned under an optical lens 105. Also included in the combination of the emitters 1144 at each pixel emission point 1144 of the matrix is a color and intensity controllable pixel light emitter 120. In the example, the pixel light emitter 120 includes a red emitter (R) 1200A, a green emitter (G) 1200B, and a blue emitter (B) 1200C, although additional or alternative color pixel light emitters may be provided. In examples, the pixel light emitters 1200A-C may be LED devices. The white illumination light sources 115A-E may be a LED of a type commonly used in LED based lighting equipment. The pixel light emitter 120 may be a combined device having the RGB emitters in the same package or on the same chip substrate. The white illumination light sources 115A-E may be capable of an output intensity higher than any of the red emitter (R) 1200A, the green emitter (G) 1200B, and the blue emitter (B) 1200C and/or higher that the maximum output intensity of overall pixel light emitter 120. It should be understood that in some examples the combination of emitters 1144 on the circuit board 1142 of the combined matrix 1114 may not include the pixel light emitter 120 and may only include a matrix of illumination light sources 115A-E covered by the optical lens 105, and thus the luminaire does not include an image display.

The present example also encompasses arrangements in which one emitter chip or package includes RGBW emitters if the white capability is sufficient for a lighting application. The white illumination light sources 115A-E could be on the same chip or in the same package as the sub emitters of the pixel light emitter 120. However, because of the higher intensity desired for illumination light generation, and thus the higher amount of generated heat, it may be better to provide the white illumination light emitter separately, as shown. Also, the pixel light emitter 120 may have an output distribution optimized for the display function that is different from the output distribution of white illumination light sources 115A-E optimized for the illumination function. To provide these distributions, however, corresponding optics may be added. If the display and illumination emitters are Lambertian or emitting in a wide angle, for example, additional space is used for these optics due to etendue limitation, which may limit how close the display and illumination emitters may be placed with respect to each other.

For purposes of the general illumination, display and interference mitigation strategies, the white illumination light sources 115A-E are controllable independently of the display through a suitable driver functionality implemented as part of the driver system 1013 in the example of FIG. 6. The pixel light emitter 120 and the components thereof are controllable independently of the illumination light source through a suitable driver functionality implemented as part of the driver system 1013 in the example of FIG. 10. Although integrated into one matrix on the circuit board 1142, the white illumination light sources 115A-E and pixel light emitter 120 therefore are logically two independent emission matrices for purposes of light generation and control. As a result, the logical matrices may be controlled in essentially the same ways as the matrices of the separate illumination light sources and displays in the earlier examples.

FIG. 13 is a simplified cross-sectional view of a luminaire 1000 incorporating the circuit board 1142 and combined/integrated matrix of emitters at pixel points 1144. In addition, the luminaire 1000 may include a diffuser 1149, which helps to homogenize output light for both illumination and image display. As shown in the drawing example, the diffuser 1149 may be a separate sheet or layer, e.g. of a suitable white translucent material, adjacent to or formed on output of the luminaire 1000.

The example includes the diffuser 1149, but the diffuser is optional. If not provided, the point sources of light, e.g. outputs from the LEDs of white illumination light sources 115A-E and pixel light emitter 120 at points 1144, may be visible through the light luminaire output.

For illumination, the diffuser 1149 diffuses the illumination light output, which improves uniformity of illumination light output intensity, as may be observed across the output through the luminaire and/or as the illumination light is distributed at a working distance from the luminaire 1000 (e.g. across a floor or desktop).

For display, the diffuser 1149 diffuses the image light from the pixel light emitters 120. For some types/resolutions of the display, some degree of diffusion may be tolerable or even helpful. Use of higher resolution data to drive a lower resolution implementation of the display may cause the image output to become pixelated. In some cases, the pixelation may prevent a person from perceiving the intended image on the display. Processing of the image data before application thereof to drive the pixel light emitters 120 of the display and/or blurring of the output image by the diffuser 1149 effectively blur discrete rectangles or dots of the pixelated image. Such blurring of the pixelated artifacts in the output image may increase an observer's ability to perceive or recognize a low resolution output image. An implementation of such a fuzzy pixels display approach in a system 1009 (FIG. 1000) with a luminaire such as 1000 may be implemented by a combination of downsampling of the image data and use of the diffuser 1149 over the image display output. A similar diffuser may be used in other luminaire examples. Additional processing of the image data in the digital domain, e.g. Fourier transformation and manipulation in the frequency domain, may be implemented to reduce impact of low resolution image output on some types of display devices.

Figure 14:
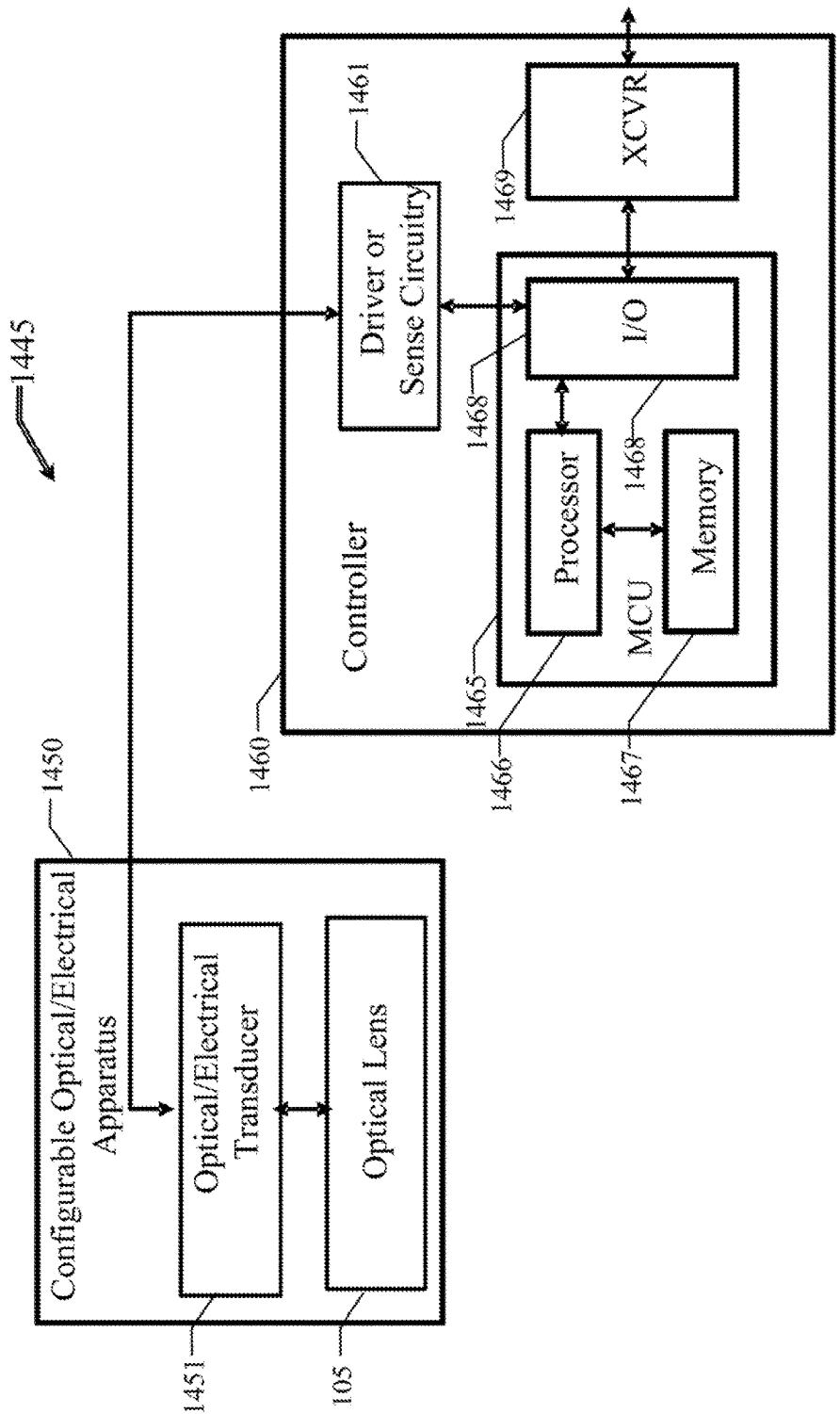
FIG. 14 is a simplified functional block diagram of a system combining an optical lens like that described with an optical-to-electrical transducer or an electrical-to-optical transducer and associated circuitry.

FIG. 14 is a simplified functional block diagram of a system 1445, which includes a configurable optical/electrical apparatus 1450 and a controller 1460. The configurable optical/electrical apparatus 1450 combines an optical lens 105 like that described above with an optical/electrical transducer 115. Although associated circuitry may be provided in the apparatus 1450, the example shows circuitry in the controller 1460, which may be somewhat separate from or even remote from the configurable optical/electrical apparatus 850.

An optical/electrical transducer 115 is a device that converts between forms of optical and electrical energy, for example, from optical energy to an electrical signal or from electrical energy to an optical output. Examples of optical-to-electrical transducers include various sensors or detectors, photovoltaic devices and the like to be individually activated for outputting the respective electrical signal in response to light. Optical-to-electrical transducers discussed herein are responsive to light, and the light may be visible light, ultraviolet light, infrared, near infrared or light in other portions of the optical spectrum.

Examples of electrical-to-optical transducers include various light emitters, although the emitted light may be in the visible spectrum or in other wavelength ranges. Suitable light generation sources for use as the transducer 115 include various conventional lamps, such as incandescent, fluorescent or halide lamps; one or more light emitting diodes (LEDs) of various types, such as planar LEDs, micro LEDs, micro organic LEDs, LEDs on gallium nitride (GaN) substrates, micro nanowire or nanorod LEDs, photo pumped quantum dot (QD) LEDs, micro plasmonic LED, micro resonant-cavity (RC) LEDs, and micro photonic crystal LEDs; as well as other sources such as micro super luminescent Diodes (SLD) and micro laser diodes. Of course, these light generation technologies are given by way of non-limiting examples, and other light generation technologies may be used to implement the transducer 115. For example, it should be understood that non-micro versions of the foregoing light generation sources can be used.

When optical/electrical transducer 115 is a light source, the light source may use a single emitter to generate light or may combine light from some number of emitters that generate the light. A lamp or 'light bulb' is an example of a single source. An LED light engine may use a single output for a single source but typically combines light from multiple LED type emitters within the single light engine. Many types of light sources provide an illumination light output that generally appears uniform to an observer, although there may be some color or intensity striations, e.g. along an edge of a combined light output. For purposes of the present examples, however, the appearance of the light source output may not be strictly uniform across the output area or aperture of the source. For example, although the source may use individual emitters or groups of individual emitters to produce the light generated by the overall source; depending on the arrangement of the emitters and any associated mixer or diffuser, the light output may be relatively uniform across the aperture or may appear pixelated to an observer viewing the output aperture. The individual emitters or groups of emitters may be separately controllable, for example to control intensity or color characteristics of the source output. As such, the light source used as an emitter type of optical/electrical transducer 115 may or may not be pixelated for control purposes. The optical lens 105 is controlled to selectively optically change or spatially (optically) modulate the light distribution output from the transducer and thus from the apparatus 1450. The optical lens 105 may support controlled beam steering, controlled beam shaping or a combination of controlled beam steering and shaping.

In another example, optical transducer 115 is an optical-to-electrical converter, that is to say, a light sensor or detector or a photovoltaic device. The overall apparatus 1450 in such a case may be configured as an imager, other light responsive sensor, light responsive power source, or the like. The light detector may be an array of light detectors, a photo-detector such as a photodiode, or a photovoltaic device, depending on the desired function of optical/electrical apparatus 1450. Other suitable light detectors for use as optical/electrical transducer 115 include charge-coupled device (CCD) arrays, complementary metal-oxide-semiconductor (CMOS) arrays, photomultipliers, image intensifiers, phototransistors, photo resistors, thermal imagers, and micro-electromechanical systems (MEMS) imagers. Nonetheless, virtually any detector of light may be used as the transducer 115 in an optical-to-electrical arrangement of apparatus 1460. Suitable light detectors will be known to one of ordinary skill in the art from the description herein. The optical lens 105 is controlled to selectively optically change or spatially (optically) modulate the field of view of light coming into the apparatus 1450 for delivery to transducer 115. The optical lens 105 may support controlled beam steering, controlled beam shaping or a combination of controlled beam steering and shaping, with respect to light from a field of intended view for the particular optical-to-electrical application of the apparatus 1450.

While light source examples and light detector examples are described separately, it will be understood that both types of optical/electrical transducers 115 may be present in a single optical apparatus 1450 and/or some optical transducers can serve both input and output functions (e.g. some LEDs can be multiplexed between the emitting operation and a light detection operation). Such a combined arrangement or operation, for example, may advantageously provide capabilities to reconfigure the light output distribution in accordance with a desired light detection pattern.

A transducer 115, such as a light emitter or a light detector, often connects to corresponding electrical circuitry to operate the particular type of transducer, e.g. a driver circuit to supply power to an emitter or a sense circuit to process an output signal from a detector (and provide power to the detector if necessary). Hence, to operate the transducer 115, the controller 1460 includes corresponding driver or sense circuitry 1461. The type of circuitry 1461 would depend on the type of transducer 115.

The controller 1460 also includes a processor, one or more digital storage media, data and programming in the storage and appropriate input/output circuitry. Although other processor based architectures may be used (another example is described later regarding FIG. 15), the example of controller 1460 utilizes a Micro-Control Unit (MCU) 1465, which implements the control logic for the controller 1460 and thus of the system 1445. For example, the MCU 1465 implements the logic for control of operations of the associated optical/electrical apparatus 1450. Although shown as controlling only one such apparatus 1450, the MCU and controller may control a number of such apparatuses 1450.

The MCU 1465 may be a microchip device that incorporates a processor 1466 serving as the programmable central processing unit (CPU) of the MCU 1465 as well as one or more memories, represented by memory 1467 in the drawing. The memory 1467 is accessible to the processor 1466, and the memory or memories 1467 store executable programming for the CPU formed by processor 1466 as well as data for processing by or resulting from processing of the processor 1466. The MCU 1465 may be thought of as a small computer or computer like device formed on a single chip. Such devices are often used as the configurable control elements embedded in special purpose devices rather than in a computer or other general purpose device. A variety of available MCU chips, for example, may be used as the MCU 1465 in the controller 1460 of system 1445.

The MCU 1465 in this example also includes various input and output (I/O) interfaces, shown collectively by way of example as interface 1468 in FIG. 14. The I/O interfaces 1468, for example, support a control output and/or input to the driver or sense control circuitry 1461 (for the optical/electrical transducer 115). The I/O interfaces 1468 also support input/output communications with one or more electronic devices, which may be connected to or incorporated in the system 1445 (e.g. to provide a user interface not shown) or which may be remote.

In the illustrated example, the controller 1460 also includes a communication transceiver (XCVR) 1469 coupled to the processor 1466 (and possibly to the memory 1467) via an I/O output interface 1468 of the MCU 1465. Although shown separately, the transceiver 1469 may be implemented in circuitry on the same chip as the elements of the MCU 1465. Although the drawing shows only one transceiver 1469, controller 1460 may include any number of transceivers, for example, to support additional communication protocols and/or provide communication over different communication media or channels.

The transceiver 1469 supports communication with other control or processing equipment, for example, with a remote user interface device and/or with a host computer of a building control and automation system (BCAS). The transceiver 1469 may also support system communication with a variety of other equipment of other parties having access to the system 1445 in an overall/networked system encompassing a number of similar systems 1445, e.g. for access to each system 1445 by equipment of a manufacturer for maintenance or access to an on-line server for downloading of programming instructions or configuration data for setting aspects of sensing or lighting operation of the associated optical/electrical apparatus(s) 1450. The circuitry of the transceiver 1469 may support such communication(s) over any available medium, such as wire(s), cable, optical fiber, free-space optical link or radio frequency (RF) link.

Figure 15:
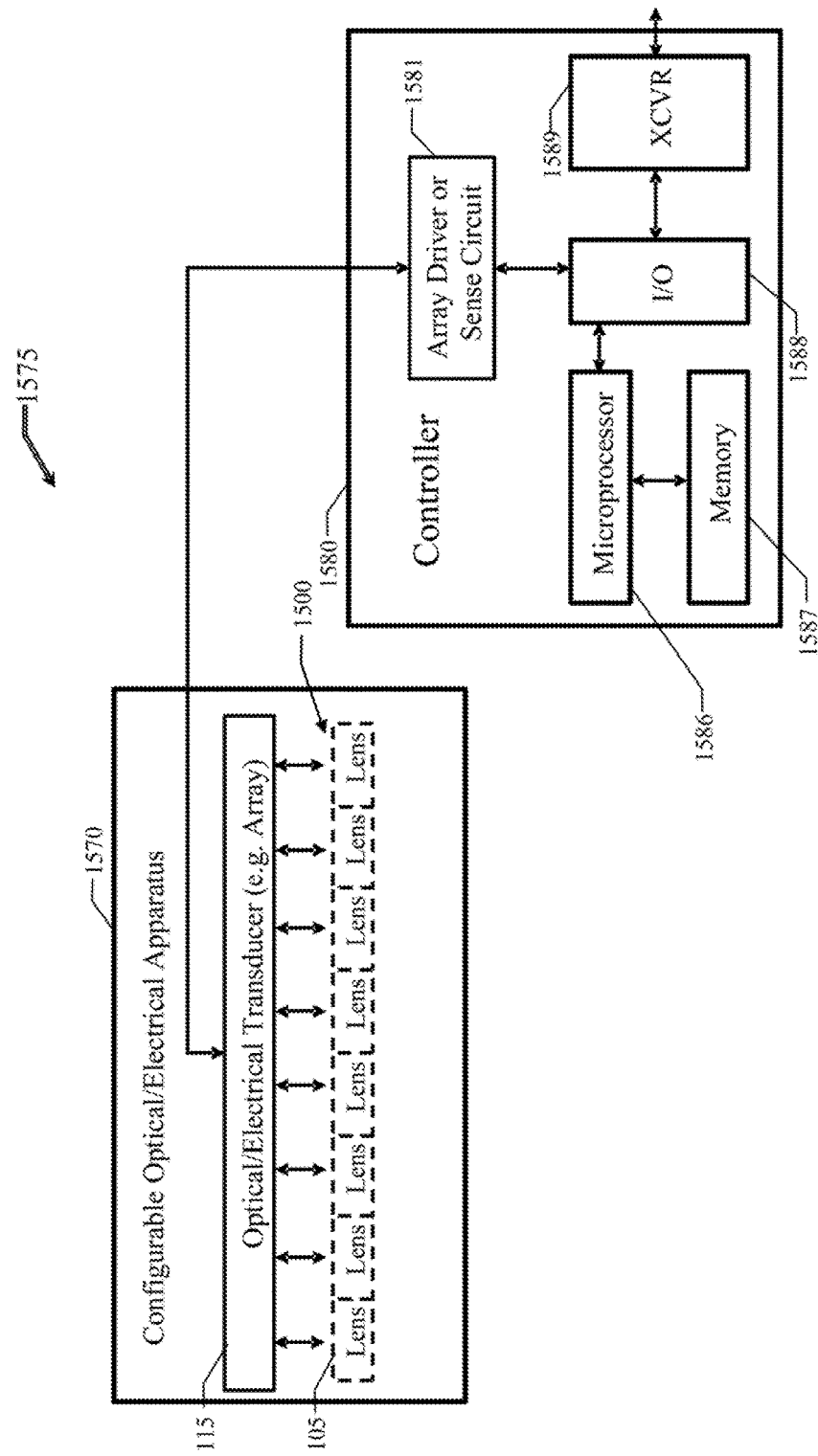
FIG. 15 is a simplified functional block diagram of a system combining an optical lens array like that of FIG. 14 with one or more transducers and associated circuitry.
Figure 8:
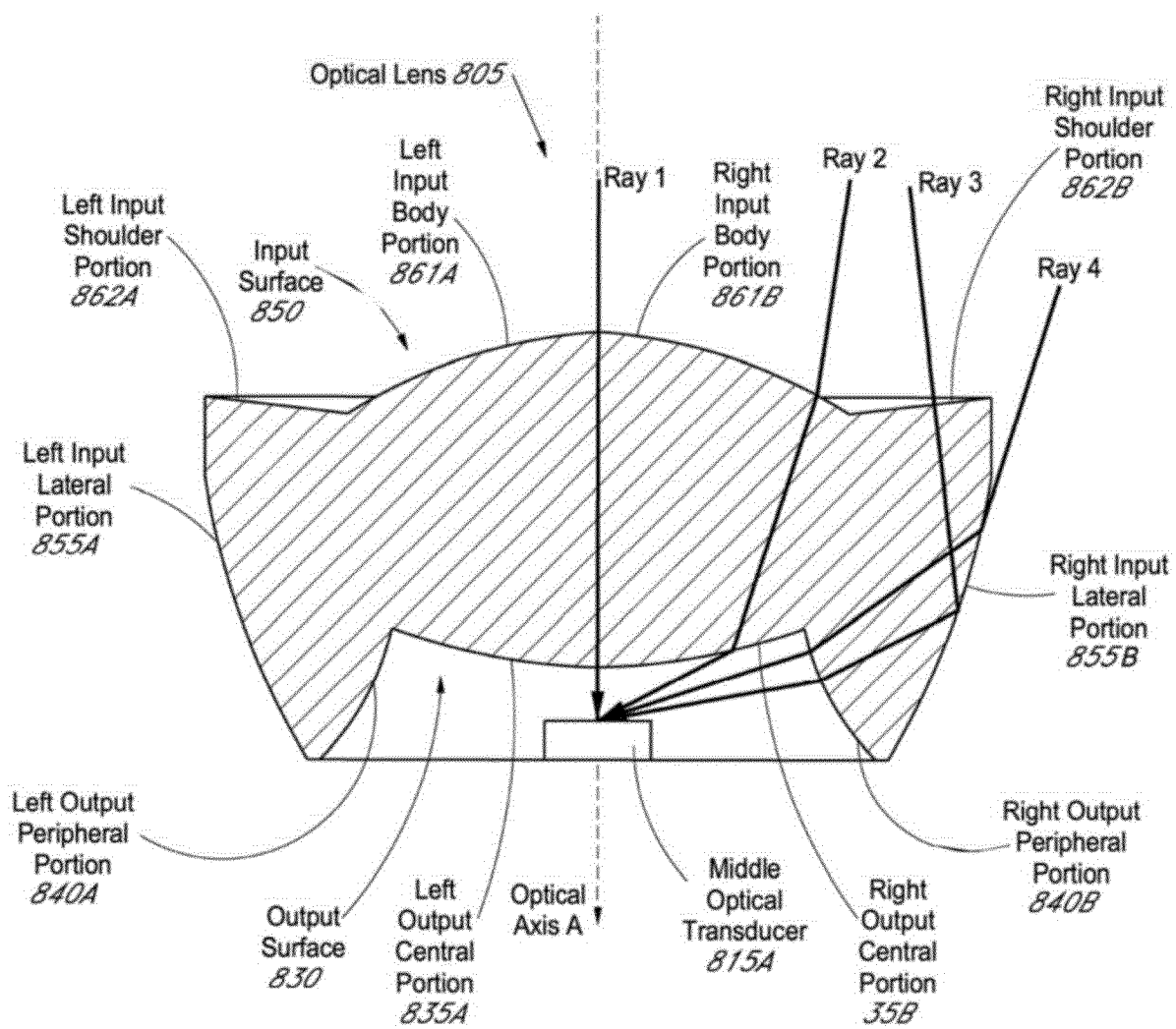

FIG. 15 is a simplified functional block diagram of a system 1575 combining an optical lens array 1500 like that described with one or more optical or electrical transducers 115 (combined in a configurable optical/electrical apparatus 1570). The drawing also depicts an example of associated circuitry, which is implemented in a controller 1580. The optical lens array 1500 is used to provide selectively controllable beam steering and/or beam shaping for any of a variety of types of optical/electrical transducers 115, including both light detectors and light emitters. The controller 1580 may be included in the apparatus 1570, or the controller 1580 may be somewhat separate from or even remote from the configurable optical/electrical apparatus 1570.

The optical/electrical transducer 115 may be any transducer device of the types discussed above, although the transducer 115 is configured to operate with an array 1500 of optical lenses 105. Although the transducer 115 may be a single device, e.g. a single relatively large light source, in many examples, transducer 115 is an array of emitters and/or lighting input responsive devices (e.g. detectors or photovoltaic devices). In a luminaire example using the apparatus 1570, the transducer 115 might include an array of high intensity LED light emitters, where each one of the emitters is coupled to one or more of the optical lenses 105 of the array 1500. In a detector example using the apparatus 1570, the transducer 115 might include a complementary metal-oxide-semiconductor (CMOS) image sensor, a charge-coupled device (CCD) image sensor or other image detector array like any of those used in digital cameras. Each actual detector at a pixel of the image sensor array could be coupled to one or more of the optical lenses 105 of the array 1500.

A transducer 115, such as a light emitter or a light detector, often connects to corresponding electrical circuitry to operate the particular type of transducer, e.g. a driver circuit array to supply power to each emitter of an emitter array or sense circuitry to process output signals from the detectors (and provide power to the detectors if/when necessary). Hence, to operate the transducer 115, the controller 1580 includes corresponding an array driver or sense circuit 1581. The type of circuitry 1581 would depend on the type of transducer 115, e.g. the particular array of emitters of a display or multi-pixel luminaire type source or the particular type of image sensor array.

The controller 1580 also includes a processor, which in this example, is implemented by a microprocessor 1586. The microprocessor 1586 is programmed to implement control and other processing functions of a central processing unit (CPU) of the controller 1580. The microprocessor 1586, for example, may be based on any known or available microprocessor architecture, such as a Reduced Instruction Set Computing (RISC) using ARM architecture, as commonly used today in mobile devices and other portable electronic devices. Of course, other microprocessor circuitry may be used to form the CPU of the controller 1580. Although the illustrated example includes only one microprocessor 1586, for convenience, a controller 1580 may use a multi-processor architecture.

The controller 1580 also includes one or more digital storage media, represented by the memory 1587, for storage of data and programming. The storage media represented by the memory 1587 may include volatile and/or non-volatile semiconductor memory, any suitable type of magnetic or optical storage media, etc. The microprocessor 1586 implements the control logic for the controller 1580 and thus of the system 1575, based on executable instructions of the programming, which in the example is stored in the memory 1587. The executable instructions may be firmware or software instructions, to configure the microprocessor 1586 to perform lighting control operations or light detection operations, etc. Based on execution of the program instructions, the microprocessor 1586, for example, implements the logic for control of operations of the transducer 115 and the array 1500, in the associated optical/electrical apparatus 1570. Although shown as controlling only one such apparatus 1570, the microprocessor 1586 and thus the controller 1580 may control a number of such apparatuses 1570.

Although shown in simplified block form, the architecture of controller 1580 may be similar to that of any of a variety of types of types of other smart electronic devices, such as an architecture for a personal computer or an architecture for a mobile terminal device.

The processor 1466 of the MCU 1465 (FIG. 14) and the microprocessor 1586 (FIG. 15) are examples of processors that may be used to control the luminaire 1000 and control or respond to outputs of any associated optical/electrical transducer(s). As used herein, a processor is a hardware circuit having elements structured and arranged to perform one or more processing functions, typically various data processing functions. Although discrete logic components could be used, the examples utilize components forming a programmable central processing unit (CPU). A processor for example includes or is part of one or more integrated circuit (IC) chips incorporating the electronic elements to perform the functions of the CPU.

The processor 1466 or the microprocessor 1586 executes programming or instructions to configure the system 1445 or 1575 to perform various operations. For example, such operations may include various general operations (e.g., a clock function, recording and logging operational status and/or failure information) as well as various system-specific operations (e.g. controlling beam steering and beam shaping of input or output light, operation of the transducer(s) and the like) of an optical/electrical apparatus 1450 or 1570 incorporating one or more of the optical lenses 105 in an optical lens array 1500 and associated transducer(s). Although a processor may be configured by use of hardwired logic, typical processors in lighting devices are general processing circuits configured by execution of programming, e.g. instructions and any associated setting data from the memories shown or from other included storage media and/or received from remote storage media.

As outlined above, a class of applications of the optical lens 105 with suitable light source type transducers provide configurable luminaires. The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or area of a premises to a level useful for a human in or passing through the space, e.g. general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below. Other large format lighting applications for the optical lens constructs include vehicle lighting or the like.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A lighting device comprising:
a plurality of individually controllable illumination light sources configured to be driven by electrical power to emit light;
an optical lens positioned over the illumination light sources, the optical lens having a plurality of aspheric or spheric surfaces, including an input surface coupled to receive light from the illumination light sources and an output surface;
the input surface includes an input peripheral portion and an input central portion, wherein:
the input peripheral portion extends from the illumination light sources and curves from a region of the illumination light sources towards the input central portion, and
the input central portion curves towards the illumination light sources; and
the output surface includes an output lateral portion, an output shoulder portion, and an output body portion, wherein:
the output lateral portion extends away from the illumination light sources, curves away from the input peripheral portion, and intersects the output shoulder portion;
the output shoulder portion abuts the output body portion; and
the output body portion curves outwards from the illumination light sources and the output shoulder portion.

2. The lighting device of claim 1, wherein:
incoming light rays for illumination lighting emitted by at least one of the illumination light sources first pass through the input surface where the incoming light rays undergo refraction to shape or steer the illumination lighting; and
after passing through the input surface, the refracted incoming light rays then pass through the output surface where the incoming light rays undergo further refraction to shape or steer the illumination lighting.

3. The lighting device of claim 1, wherein:
incoming light rays for illumination lighting emitted by at least one of the illumination light sources first pass through the input surface where the incoming light rays undergo refraction to shape or steer the illumination lighting;
after passing through the input surface, the refracted incoming light rays then strike the output lateral portion where the incoming light rays undergo total internal reflection (TIR) to further shape or steer the illumination lighting; and after striking the output lateral portion, the TIR incoming light rays pass through the output shoulder portion without undergoing further refraction.

4. The lighting device of claim 1, wherein:
the optical lens is circular or oval shaped;
the output shoulder portion is continuously arranged around the output body portion; and
the input peripheral portion is continuously arranged around the plurality of illumination light sources.

5. The lighting device of claim 1, wherein:
the optical lens is circular shaped;
the output shoulder portion is annularly arranged around the output body portion; and
the input peripheral portion is annularly arranged around the plurality of illumination light sources.

6. The lighting device of claim 1, wherein:
the optical lens is rectangular or square shaped; and
the plurality of illumination light sources are arranged inside a base in rows and columns to form a matrix underneath the optical lens.

7. The lighting device of claim 6, wherein:
the output shoulder portion includes left and right output shoulder portions which are linearly arranged along opposing sides of a length of the output body portion; and
the input peripheral portion includes left and right input peripheral portions which are aspheric surfaces that are linearly arranged along opposing sides of the input central portion.

8. The lighting device of claim 1, wherein:
the output body portion and the input central portion each have an aspheric contour; and
the output body portion and the input central portion curve in opposing directions.

9. The lighting device of claim 1, wherein the output shoulder portion is flat or slopes upwards from a circumference of the output body portion where the output shoulder portion surrounds the output body portion.

10. The lighting device of claim 1, further comprising:
a circuit board including the illumination light sources disposed thereon; and
a plurality of pixel light emitters disposed on the circuit board co-planar with the illumination light sources and disposed outside of the optical lens so as to not be covered by the input surface.

11. The lighting device of claim 1, further comprising:
an illumination lighting board including the illumination light sources disposed thereon;
a display lighting board; and
a plurality of pixel light emitters disposed on the display lighting board;
wherein the display lighting board and the illumination lighting board are optically coupled.

12. The lighting device of claim 1, wherein:
an optical axis of the optical lens passes through a middle of the input central portion and the output body portion of the optical lens and bisects a cross-section of the optical lens into left and right sides;
the left side of the cross-section includes a left output lateral portion, a left output shoulder portion, a left output body portion, a left input peripheral portion, and a left input central portion; and
the right side of the cross-section includes a right output lateral portion, a right output shoulder portion, a right output body portion, a right input peripheral portion, and a right input central portion.

13. The lighting device of claim 12, wherein:
the left output lateral portion extends away from the illumination light sources, curves away from the left input peripheral portion and intersects the left output shoulder portion; and
the right output lateral portion extends away from the illumination light sources, curves away from the right input peripheral portion and intersects the right output shoulder portion.

14. The lighting device of claim 12, wherein:
the left output shoulder portion intersects the left output lateral portion and the left output body portion; and
the right output shoulder portion intersects the right output lateral portion and the right output body portion.

15. The lighting device of claim 12, wherein the left output lateral portion and the right output lateral portion have an aspheric contour and curve in opposing directions.

16. The lighting device of claim 12, wherein the left input central portion and the right input central portion have an aspheric contour and curve in opposing directions.

17. The lighting device of claim 1, wherein:
the illumination light sources are disposed on a circuit board;
the optical lens includes:
a base coupled to the circuit board, and
at least one leg extending longitudinally from the base, a foot coupled to a distal end of the at least one leg extending laterally with respect to the base;
the at least one leg extends longitudinally through an opening formed in the circuit board; and
the foot extends laterally beneath the circuit board to secure the optical lens to the circuit board.

18. An optical device comprising:
a plurality of optical-to-electrical transducers, each optical-to-electrical transducer being configured to be driven by received light to produce a respective electrical signal and to be individually activated for outputting the respective electrical signal in response to light;
an optical lens positioned over the optical-to-electrical transducers, the optical lens having a plurality of aspheric or spheric surfaces, including an input surface and an output surface coupled to direct light to the optical-to-electrical transducers; and
the input surface includes an input lateral portion, an input shoulder portion, and an input body portion, wherein:
the input lateral portion extends towards the optical-to-electrical transducers, curves towards the output peripheral portion, and intersects the input shoulder portion,
the input shoulder portion surrounds the input body portion, and
the input body portion curves outwards from the input shoulder portion;
the output surface includes an output peripheral portion and an output central portion, wherein:
the output peripheral portion curves around the optical-to-electrical transducers towards the output central portion, and
the output central portion curves towards the optical-to-electrical transducers.

19. The optical device of claim 18, wherein:
incoming light rays drive one or more of the optical-to-electrical transducers first pass through the input surface where the incoming light rays undergo refraction; and
after passing through the input surface, the refracted incoming light rays then pass through the output surface where the refracted incoming light rays undergo further refraction to shape or steer the light rays to be selectively received by at least one of the optical-to-electrical transducers.

20. The optical device of claim 18, wherein each optical-to-electrical transducer is a photo sensor or a photovoltaic device.

21. An optical lens formed of an optical material, the optical lens comprising:
- a plurality of aspheric or spheric surfaces, including a first surface and a second surface;
- the first surface including a peripheral portion and a central portion, wherein:
  - the peripheral portion of the first surface extends from a base of the optical lens and curves from a perimeter of the base of the optical lens to the central portion of the first surface, and
  - the central portion of the first surface curves outward toward an area encompassed by the base of the optical lens; and
- the second surface including a lateral portion, a shoulder portion, and a body portion, wherein:
  - the lateral portion of the second surface extends away from the base of the optical lens, curves away from the peripheral portion of the second surface, and intersects the shoulder portion of the second surface;
  - the shoulder portion of the second surface abuts the output body portion of the second surface; and
  - the body portion of the second surface curves outwards away from the base of the optical lens and the shoulder portion of the second surface.

22. A device comprising the optical lens of claim 21, in combination with:
- a circuit board; and
- a plurality of individually operable transducers optically coupled to the first surface of the optical lens, each transducer being of a type capable of being driven by electrical power to emit light or of being driven by light to produce an electrical signal.

23. The device of claim 22, further comprising:
- a controller coupled to selectively activate the transducers to selectively adjust a beam of light output or a field of view of the device through the optical lens.

24. The device of claim 22, wherein the transducers are light sources.

25. The device of claim 22, wherein the transducers are optical-to-electrical transducers.

\* \* \* \* \*

UNITED STATES PATENT AND TRADEMARK OFFICE
CERTIFICATE OF CORRECTION

PATENT NO. : 10,190,746 B1
APPLICATION NO. : 15/868624
DATED : January 29, 2019
INVENTOR(S) : An Mao et al.

It is certified that error appears in the above-identified patent and that said Letters Patent is hereby corrected as shown below:

In the Drawings

Drawing Sheet 7, print of FIG. 8, replace with the attached Drawing Sheet of FIG. 8.

Signed and Sealed this
Second Day of April, 2019

Andrei Iancu
*Director of the United States Patent and Trademark Office*